US007460406B2

(12) United States Patent
Mokhlesi et al.

(10) Patent No.: US 7,460,406 B2
(45) Date of Patent: Dec. 2, 2008

(54) ALTERNATE SENSING TECHNIQUES FOR NON-VOLATILE MEMORIES

(75) Inventors: Nima Mokhlesi, Los Gatos, CA (US); Jeffrey W. Lutze, San Jose, CA (US)

(73) Assignee: SanDisk Corporation, Milpitas, CA (US)

( * ) Notice: Subject to any disclaimer, the term of this patent is extended or adjusted under 35 U.S.C. 154(b) by 0 days.

(21) Appl. No.: 12/023,317

(22) Filed: Jan. 31, 2008

(65) Prior Publication Data

US 2008/0123414 A1 May 29, 2008

Related U.S. Application Data

(62) Division of application No. 11/321,996, filed on Dec. 28, 2005, now Pat. No. 7,349,264.

(51) Int. Cl.
*G11C 11/34* (2006.01)

(52) U.S. Cl. ............................ 365/185.21; 365/185.03; 365/185.17; 365/185.22; 365/185.25

(58) Field of Classification Search ............ 365/185.24, 365/185.21
See application file for complete search history.

(56) References Cited

U.S. PATENT DOCUMENTS 5,177,706 A 1/1993 Shinohara et al.
5,412,601 A 5/1995 Sawada et al.
5,521,865 A 5/1996 Ohuchi et al.
5,570,315 A 10/1996 Tanaka et al.
5,602,789 A 2/1997 Endoh et al.
5,652,719 A 7/1997 Tanaka et al.
5,740,112 A 4/1998 Tanaka et al.

(Continued)

FOREIGN PATENT DOCUMENTS

EP 0 673 037 9/1995

(Continued)

OTHER PUBLICATIONS

Nobukata et al., "A 144Mb 8-Level NAND Flash Memory with Optimized Pulse Width Programming," *1999 Symposium on VLSI Circuits Digest of Technical Papers*, pp. 39-40.

(Continued)

*Primary Examiner*—Hoai V Ho
*Assistant Examiner*—Jason Lappas
(74) *Attorney, Agent, or Firm*—Davis Wright Tremaine LLP

(57) ABSTRACT

The present invention presents a scheme for sensing memory cells. Selected memory cells are discharged through their channels to ground and then have a voltage level placed on the traditional source and another voltage level placed on the control gate, and allowing the cell bit line to charge up. The bit line of the memory cell will then charge up until the bit line voltage becomes sufficiently high to shut off any further cell conduction. The rise of the bit line voltage will occur at a rate and to a level dependent upon the data state of the cell, and the cell will then shut off when the bit line reaches a high enough level such that the body effect affected memory cell threshold is reached, at which point the current essentially shuts off. A particular embodiment performs multiple such sensing sub-operations, each with a different control gate voltage, but with multiple states being sensed in each operation by charging the previously discharged cells up through their source.

12 Claims, 11 Drawing Sheets

U.S. PATENT DOCUMENTS

| | | | |
|---|---|---|---|
| 5,870,334 | A | 2/1999 | Hemink et al. |
| 5,949,714 | A | 9/1999 | Hemink et al. |
| 5,969,985 | A | 10/1999 | Tanaka et al. |
| 6,044,013 | A | 3/2000 | Tanaka et al. |
| 6,069,821 | A | 5/2000 | Jun et al. |
| 6,134,140 | A | 10/2000 | Tanaka et al. |
| 6,134,141 | A | 10/2000 | Wong |
| 6,181,599 | B1 | 1/2001 | Gongwer |
| 6,208,560 | B1 | 3/2001 | Tanaka et al. |
| 6,222,762 | B1 | 4/2001 | Guterman et al. |
| 6,259,627 | B1 | 7/2001 | Wong |
| 6,266,270 | B1 | 7/2001 | Nobukata |
| 6,282,117 | B1 | 8/2001 | Tanaka et al. |
| 6,363,010 | B2 | 3/2002 | Tanaka et al. |
| 6,373,746 | B1 | 4/2002 | Takeuchi et al. |
| 6,434,055 | B2 | 8/2002 | Tanaka et al. |
| 6,462,986 | B1 | 10/2002 | Khan |
| 6,462,988 | B1 | 10/2002 | Harari |
| 6,545,909 | B2 | 4/2003 | Tanaka et al. |
| 6,549,464 | B2 | 4/2003 | Tanaka et al. |
| 6,556,475 | B2 | 4/2003 | Yamazaki et al. |
| 6,798,698 | B2 | 9/2004 | Tanaka et al. |
| 7,092,295 | B2 | 8/2006 | Iwase et al. |
| 7,106,626 | B2 | 9/2006 | Goldman et al. |
| 2002/0101778 | A1 | 8/2002 | Khan |
| 2002/0118574 | A1 | 8/2002 | Gongwer et al. |
| 2004/0252567 | A1 | 12/2004 | Kato |
| 2005/0013169 | A1 | 1/2005 | Tanaka et al. |
| 2006/0291285 | A1 | 12/2006 | Mokhlesi |
| 2007/0171744 | A1 | 7/2007 | Mokhlesi et al. |

FOREIGN PATENT DOCUMENTS

| | | | |
|---|---|---|---|
| WO | 2004053882 | A1 | 6/2004 |
| WO | 2004114316 | A2 | 12/2004 |
| WO | WO 2007/076451 | | 7/2007 |

OTHER PUBLICATIONS

Johnson et al., "THPM 12.6: A 6Kb Electrically Erasable Nonvolatile Memory," *International Solid State Circuits Conference*, Feb. 14, 1980, pp. 152-153, 271.

Ohkawa et al., "A 98mm$^2$ 3.3V 64Mb Flash Memory with FN-NOR Type 4-Level Cell," *IEEE International Solid State Circuits Conference*, Session 2, Flsh Memory, Paper TP 2.3, 1996, 36-37.

EPO/ISA, "Notification of Transmittal of the International Search Report and the Written Opinion of the Inernational Searching Authority, or the Declaration," mailed in related International Patent Application No. PCT/US2006/062513 on Jul. 19, 2007, 15 pages.

USPTO, "Office Action," mailed in related U.S. Appl. No. 11/320,917 on Aug. 16, 2007, 28 pages.

Office Action for Application No. 11/320,917 mailed Apr. 29, 2008, 30 pages.

| | Erase | Program Promotion | Program Inhibition | Read10 | Read10 for 1st Pass | Read10 for 2nd Pass | Read00 | Read00 for 2nd Pass | Read01 | Verify10 for 1st Pass | Verify10 for 2nd Pass | Verify00 for 1st Pass | Verify00 for 2nd Pass | Verify01 |
|---|---|---|---|---|---|---|---|---|---|---|---|---|---|---|
| *BLe* | Floating | 0V | Vdd | H or L | H or L | H or L | H or L | H or L | H or L | H or L | H or L | H or L | H or L | H or L |
| BLo | Floating | Vdd | Vdd | 0V | 0V | 0V | 0V | 0V | 0V | 0V | 0V | 0V | 0V | 0V |
| SGD | Floating | Vdd | Vdd | 4.5V | 4.5V | 4.5V | 4.5V | 4.5V | 4.5V | 4.5V | 4.5V | 4.5V | 4.5V | 4.5V |
| WL3 | 0V | 10V | 10V | 4.5V | 4.5V | 4.5V | 4.5V | 4.5V | 4.5V | 4.5V | 4.5V | 4.5V | 4.5V | 4.5V |
| *WL2* | 0V | Vpgm | Vpgm | 0V | 0V | 0V | 1V | 1V | 2V | 0.2V | 0.4V | 1.2V | 1.4V | 2.4V |
| WL1 | 0V | 10V | 10V | 4.5V | 4.5V | 4.5V | 4.5V | 4.5V | 4.5V | 4.5V | 4.5V | 4.5V | 4.5V | 4.5V |
| WL0 | 0V | 10V | 10V | 4.5V | 4.5V | 4.5V | 4.5V | 4.5V | 4.5V | 4.5V | 4.5V | 4.5V | 4.5V | 4.5V |
| SGS | Floating | 0V | 0V | 4.5V | 4.5V | 4.5V | 4.5V | 4.5V | 4.5V | 4.5V | 4.5V | 4.5V | 4.5V | 4.5V |
| C-source | Floating | 0V | 0V | 0V | 0V | 0V | 0V | 0V | 0V | 0V | 0V | 0V | 0V | 0V |
| C-p-well | 20V | 0V | 0V | 0V | 0V | 0V | 0V | 0V | 0V | 0V | 0V | 0V | 0V | 0V |

*FIG. 6*
*(PRIOR ART)*

ALTERNATE SENSING TECHNIQUES FOR NON-VOLATILE MEMORIES

CROSS-REFERENCE TO RELATED APPLICATION

The present application is a divisional of U.S. application Ser. No. 11/321,996, filed Dec. 28, 2005. The present application is also related to U.S. application Ser. No. 11/320,917, filed Dec. 28, 2005. The applications are hereby incorporated herein, in their entirety, by this reference.

FIELD OF THE INVENTION

This invention relates generally to non-volatile memories and their operation, and, more specifically, to techniques for reading such memories.

BACKGROUND OF THE INVENTION

The principles of the present invention have application to various types of non-volatile memories, those currently existing and those contemplated to use new technology being developed. Implementations of the present invention, however, are described with respect to a flash electrically erasable and programmable read-only memory (EEPROM), wherein the storage elements are floating gates, as exemplary.

It is common in current commercial products for each floating gate storage element of a flash EEPROM array to store a single bit of data by operating in a binary mode, where two ranges of threshold levels of the floating gate transistors are defined as storage levels. The threshold levels of a floating gate transistor correspond to ranges of charge levels stored on their floating gates. In addition to shrinking the size of the memory arrays, the trend is to further increase the density of data storage of such memory arrays by storing more than one bit of data in each floating gate transistor. This is accomplished by defining more than two threshold levels as storage states for each floating gate transistor, four such states (2 bits of data per floating gate storage element) now being included in commercial products. More storage states, such as 8 or even 16 states per storage element, are contemplated. Each floating gate memory transistor has a certain total range (window) of threshold voltages in which it may practically be operated, and that range is divided into one range for each of the number of states plus margins between the states to allow for them to be clearly differentiated from one another.

As the number of states stored in each memory cell increases, the tolerance of any shifts in the programmed charge level on the floating gate storage elements decreases. Since the ranges of charge designated for each storage state must necessarily be made narrower and placed closer together as the number of states stored on each memory cell storage element increases, the programming must be performed with an increased degree of precision and the extent of any post-programming shifts in the stored charge levels that can be tolerated, either actual or apparent shifts, is reduced. Actual shifts in the charge stored in one cell can be disturbed when reading, programming and erasing other cells that have some degree of electrical coupling with that cell, such as those in the same column or row, and those sharing a line or node.

Apparent shifts in the stored charge occur because of field coupling between storage elements. The degree of this coupling is necessarily increasing as the sizes of memory cell arrays are being decreased and as the result of improvements of integrated circuit manufacturing techniques. The problem occurs most pronouncedly between two sets of adjacent cells that have been programmed at different times. One set of cells is programmed to add a level of charge to their floating gates that corresponds to one set of data. After the second set of cells is programmed with a second set of data, the charge levels read from the floating gates of the first set of cells often appear to be different than programmed because of the effect of the charge on the second set of floating gates being coupled with the first. This is described in U.S. Pat. Nos. 5,867,429 and 5,930,167, which patents are incorporated herein in their entirety by this reference. These patents describe either physically isolating the two sets of floating gates from each other, or taking into account the effect of the charge on the second set of floating gates when reading that of the first. Further, U.S. Pat. No. 5,930,167 describes methods of selectively programming portions of a multi-state memory as cache memory, in only two states or with a reduced margin, in order to shorten the time necessary to initially program the data. This data is later read and re-programmed into the memory in more than two states, or with an increased margin.

This effect is present in various types of flash EEPROM cell arrays. A NOR array of one design has its memory cells connected between adjacent bit (column) lines and control gates connected to word (row) lines. The individual cells contain either one floating gate transistor, with or without a select transistor formed in series with it, or two floating gate transistors separated by a single select transistor. Examples of such arrays and their use in storage systems are given in the following U.S. patents and pending applications of SanDisk Corporation that are incorporated herein in their entirety by this reference: U.S. Pat. Nos. 5,095,344, 5,172,338, 5,602,987, 5,663,901, 5,430,859, 5,657,332, 5,712,180, 5,890,192, and 6,151,248, and Ser. No. 09/505,555, filed Feb. 17, 2000, and Ser. No. 09/667,344, filed Sep. 22, 2000.

A NAND array of one design has a number of memory cells, such as 8, 16 or even 32, connected in series along each string formed between a bit line and a reference potential line through select transistors at either end. Word lines are connected with control gates of cells and are formed over different series strings. Relevant examples of such arrays and their operation are given in the following U.S. patents that are incorporated herein in their entirety by this reference: U.S. Pat. Nos. 5,570,315, 5,774,397 and 6,046,935. Briefly, two bits of data, often from different logical pages of incoming data are programmed into one of four states of the individual cells in two steps, first programming a cell into one state according to one bit of data and then, if the data makes it necessary, re-programming that cell into another one of its states according to the second bit of incoming data.

In addition to improving memory performance by making programming faster, performance can also be improved by speeding up the sensing process. Shortening sensing times will improve performance both during read and verify operations; and if the memory can speed up verify, this will improve write speed. This is particularly true for multi-state memories, where a verify step is needed between any two consecutive pulses, and multi-state memories require several sensing steps in each verify operation. The performance of non-volatile memory systems could be improved if these shortcomings could be reduced or eliminated.

SUMMARY OF THE INVENTION

Briefly and generally, the present invention presents a scheme for sensing memory cells that is particularly useful for improving performance in multi-level non-volatile memory systems. This is achieved by setting an initial state in selected memory cells by discharging their channels to ground, placing a voltage level on the traditional source (such as the common electrode that connects the same end of the NAND strings in one block together) and the control gate, and allowing the cell bit line to charge up for some time as a result of conduction of current through the cell during the signal integration period. The bit line of the memory cell will then charge up until the bit line voltage becomes sufficiently high enough to shut off any further cell conduction. The rise of the bit line voltage will occur at a rate and to a level dependent upon the data state of the cell, and the cell will then shut off when the bit line, which now plays the role of the source for the NAND string, voltage reaches a high enough level such that the body effect affected memory cell threshold is reached at which point the current essentially shuts off. More specifically, an exemplary embodiment uses this technique for sensing in both the verify phase of write operations and for read operations. A plurality of cells along the same word line are sensed concurrently by placing a constant, data independent voltage on the word line and constant, data independent common voltage level on the source side of these cells. The source side is now playing the role of the drain in the sense that its voltage is higher than the bit line side. The bit lines of cells, having previously been discharged, will then cause a voltage on their respective bit lines indicative of their individual data content.

In a sub-aspect of the present invention, the present invention allows for a single pass of verify operation to verify the state of all cells being programmed, regardless of the cells target state. As the level to which the corresponding bit line will rise depends, due to the body effect, upon the state of the cell. This level can then be compared against the reference value corresponding to the respective target values. This improves performance over prior art techniques requiring multiple charge-discharge, and signal integration cycles following each program pulse, one cycle for each target state requiring a verify operation.

In another sub-aspect of the present invention, read performance is improved as all data levels can be determined based upon the single discharge-charge cycle. As the level on a given cells bit line approaches an asymptotic value determined by the data content, once these levels are reached the level on the bit line can be compared to a set of reference levels, the comparison phase performed either sequentially or concurrently.

In a further sub-aspect of the present invention, and in one set of embodiments, the peripheral circuitry supplies the reference voltages to the bit line comparators sequentially. The reference values can all be available concurrently to a multiplexing circuit that supplies the different value, or the line supplying the reference values to the comparator can itself receive the various reference values in a time multiplexed manner. Although this last technique requires the changing of the voltage level on the reference supply line, this can be effected more rapidly than recharging and discharging the bit lines for each data level.

Another aspect of the present invention is sensing the state of the multi-state memory cells by performing multiple sensing sub-operations, each with a different control gate voltage, but with multiple states being sensed in each operation by charging the previously discharged cells up through their source. By combining elements of the two diverse sensing techniques, the sensing operation is sped up, as multiple states are read in each sensing sub-operation, while the use of multiple word line voltages provides sufficient dynamic range to resolve all of the data states.

A specific embodiment of these aspects is based upon a flash memory with a NAND architecture. The cells along a selected word line are connected along bit lines to a common source line. Either an all bit line architecture or an architecture where the bit lines are divided into sets that are sensed alternately can be used.

Additional aspects, features, advantages and applications of the present invention are included in the following description of exemplary embodiments, which description should be taken in conjunction with the accompanying drawings.

BRIEF DESCRIPTION OF THE DRAWINGS

FIG. 6 provides Table 1 of example operating voltages of the NAND memory cell array of FIGS. 2-5;

DESCRIPTION OF EXEMPLARY EMBODIMENTS

EXAMPLE NON-VOLATILE MEMORY SYSTEM

Figure 1:
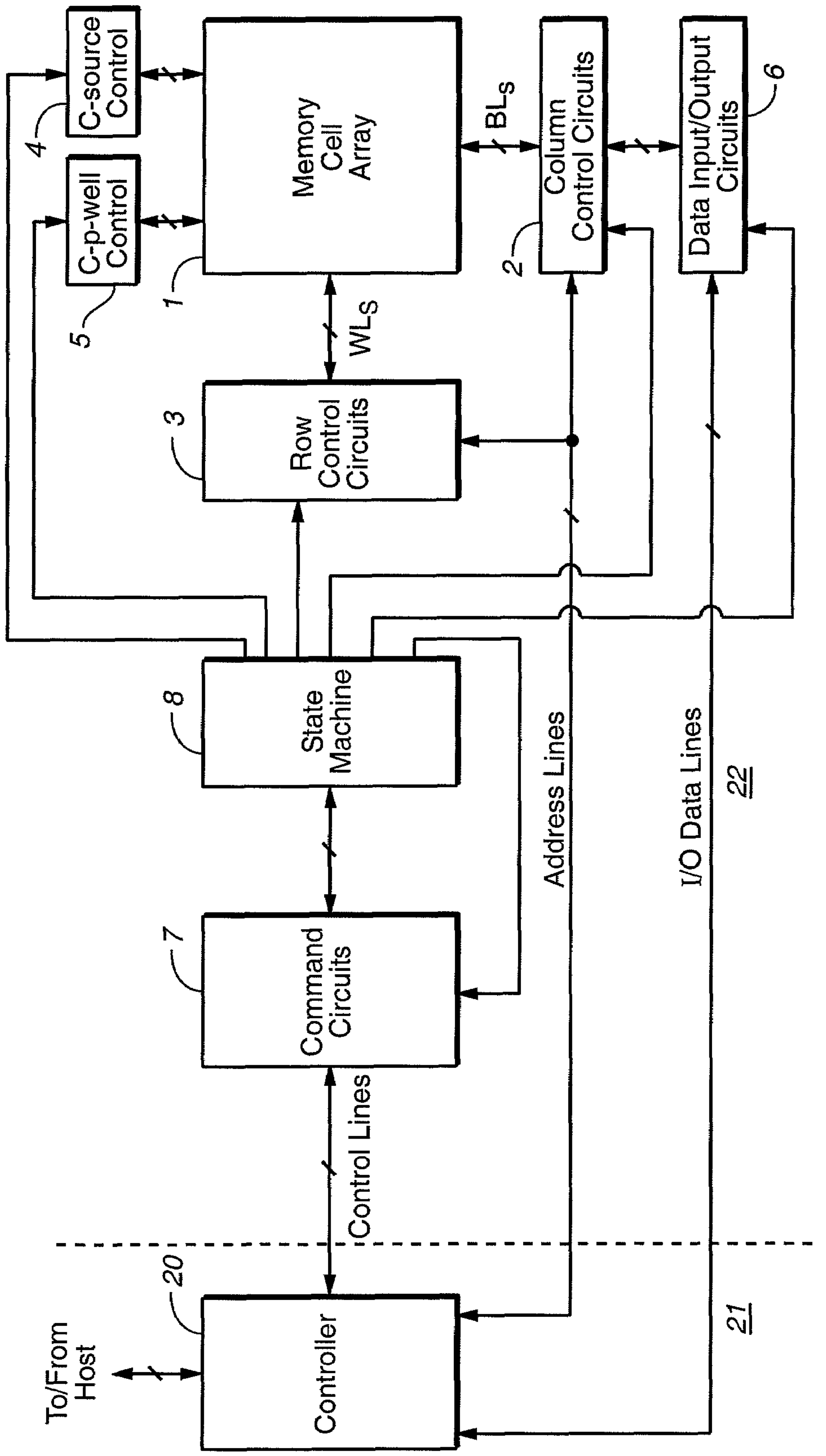
FIG. 1 is a block diagram of a non-volatile memory system in which the various aspects for implementation of the present invention are described.

With reference to FIGS. 1-7, a specific non-volatile memory system is described in which the various aspects of the present invention are implemented, in order to provide definite examples. FIG. 1 is a block diagram of a flash memory system. Memory cell array 1 including a plurality of memory cells M arranged in a matrix is controlled by a column control circuit 2, a row control circuit 3, a c-source control circuit 4 and a c-p-well control circuit 5. The column control circuit 2 is connected to bit lines (BL) of the memory cell array 1 for reading data stored in the memory cells (M), for determining a state of the memory cells (M) during a program operation, and for controlling potential levels of the bit lines (BL) to promote the programming or to inhibit the programming. The row control circuit 3 is connected to word lines (WL) to select one of the word lines (WL), to apply read voltages, to apply program voltages combined with the bit line potential levels controlled by the column control circuit 2, and to apply an erase voltage coupled with a voltage of a p-type region (labeled as "c-p-well" 11 in FIG. 3) on which the memory cells (M) are formed. The c-source control circuit 4 controls a common source line (labeled as "c-source" in FIG. 2) connected to the memory cells (M). The c-p-well control circuit 5 controls the c-p-well voltage.

The data stored in the memory cells (M) are read out by the column control circuit 2 and are output to external I/O lines via an I/O line and a data input/output buffer 6. Program data to be stored in the memory cells are input to the data input/output buffer 6 via the external I/O lines, and transferred to the column control circuit 2. The external I/O lines are connected to a controller 20.

Command data for controlling the flash memory device are input to a command interface) connected to external control lines that are connected with the controller 20. The command data informs the flash memory of what operation is requested. The input command is transferred to a state machine 8 that controls the column control circuit 2, the row control circuit 3, the c-source control circuit 4, the c-p-well control circuit 5 and the data input/output buffer 6. The state machine 8 can output a status data of the flash memory such as READY/BUSY or PASS/FAIL.

The controller 20 is connected or connectable with a host system such as a personal computer, a digital camera, or a personal digital assistant. It is the host that initiates commands, such as to store or read data to or from the memory array 1, and provides or receives such data, respectively. The controller converts such commands into command signals that can be interpreted and executed by the command circuits 7. The controller also typically contains buffer memory for the user data being written to or read from the memory array. A typical memory system includes one integrated circuit chip 21 that includes the controller 20, and one or more integrated circuit chips 22 that each contain a memory array and associated control, input/output and state machine circuits. The trend, of course, is to integrate the memory array and controller circuits of a system together on one or more integrated circuit chips. The memory system may be embedded as part of the host system, or may be included in a memory card that is removably insertable into a mating socket of host systems. Such a card may include the entire memory system, or the controller and memory array, with associated peripheral circuits, may be provided in separate cards.

Figure 2:
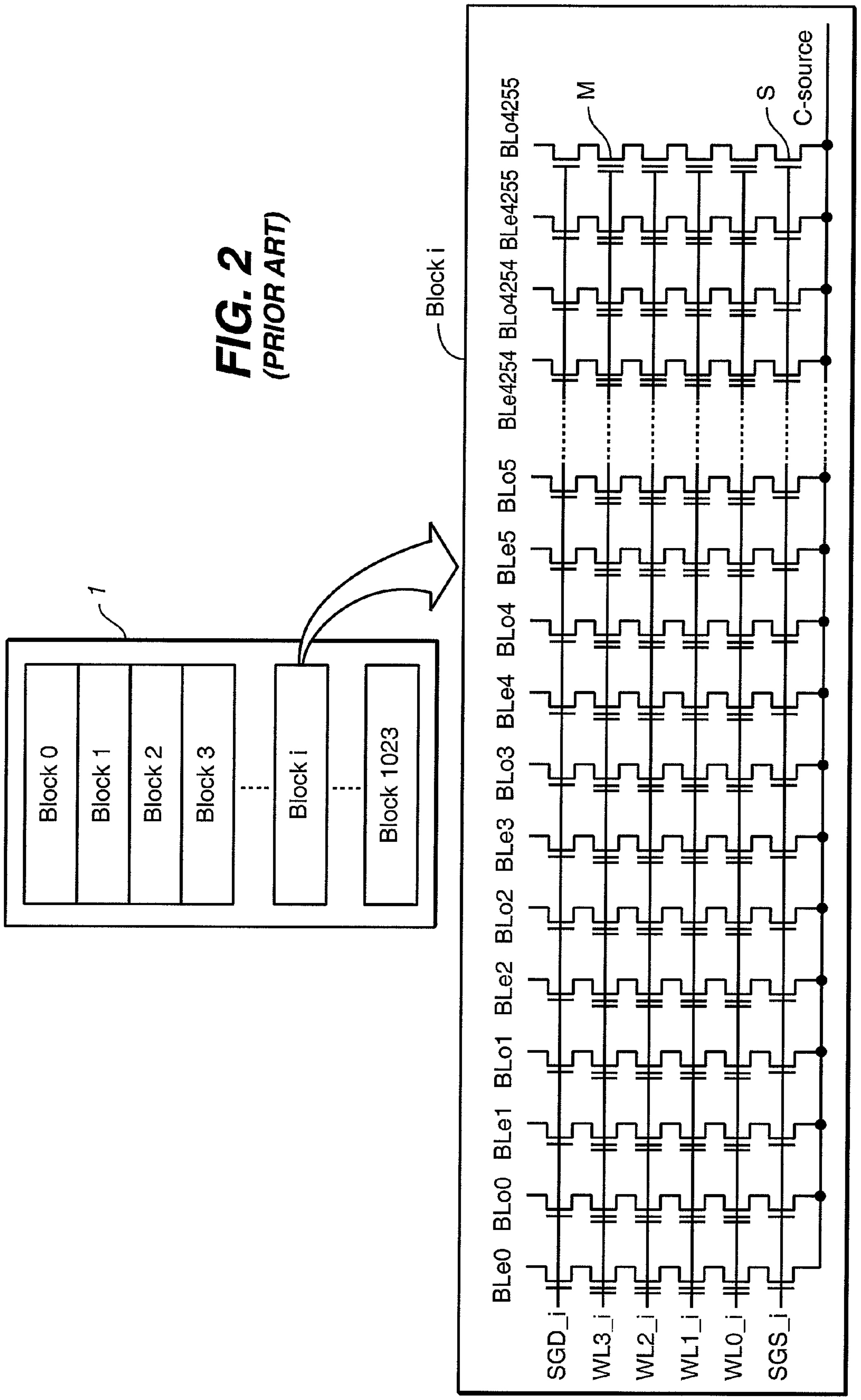
FIG. 2 illustrates an existing circuit and organization of the memory array of FIG. 1 when the memory cell array is of a NAND type.

With reference to FIG. 2, an example structure of the memory cell array 1 is described. A flash EEPROM of a NAND type is described as an example. The memory cells (M) are partitioned into 1,024 blocks, in a specific example. The data stored in each block are simultaneously erased. The block is thus the minimum unit of a number of cells that are simultaneously erasable. In each block, in this example, there are 8,512 columns that are divided into even columns and odd columns. The bit lines are also divided into even bit lines (BLe) and odd bit lines (BLo). Four memory cells connected to the word lines (WL0 to WL3) at each gate electrode are connected in series to form a NAND cell unit or NAND string. One terminal of the NAND cell unit is connected to corresponding bit line (BL) via a first select transistor whose gate electrode is coupled to a first select gate line (SGD), and another terminal is connected to the c-source via a second select transistor which gate electrode is coupled to a second select gate line (SGS). Although four floating gate transistors are shown to be included in each cell unit for simplicity, a higher number of transistors, such as 8, 16, 32, or even 64, are used.

During a user data read and programming operation, 4,256 cells (M) are simultaneously selected, in this example. The cells (M) selected have the same word line (WL), for example WL2, and the same kind of bit line (BL), for example the even bit lines BLe0, Ble2, to BLe4254. Therefore, 532 bytes of data can be read or programmed simultaneously and this unit of data is referred to as a page. Since in this example each NAND string contains 4 cells and there are two bit lines per sense amp, one block can store at least eight pages. When each memory cell (M) stores two bits of data, namely a multi-level cell, one block stores 16 pages. In this embodiment, the storage element of each of the memory cells, in this case the floating gate of each of the memory cells, stores two bits of user data.

Figure 3:
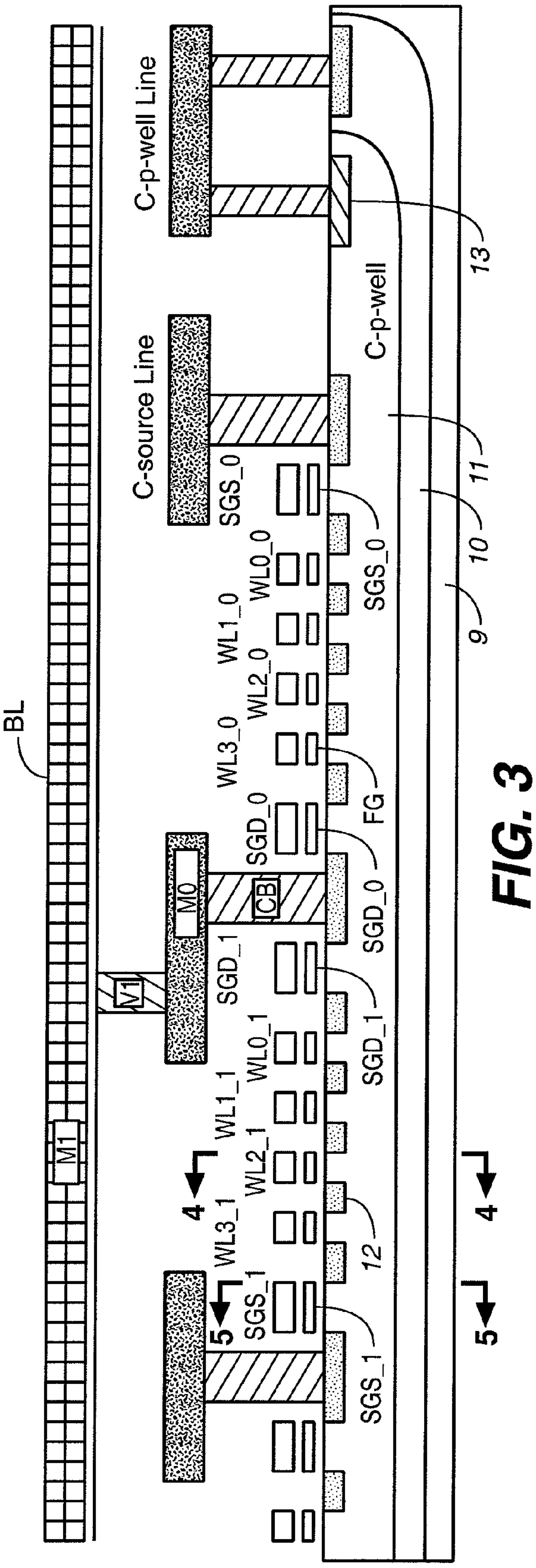
FIG. 3 shows a cross-sectional view, along a column, of a NAND type memory array formed on a semiconductor substrate.

FIG. 3 shows a cross sectional view of a NAND cell unit of the type shown schematically in FIG. 2, in the direction of the bit line (BL). At a surface of a p-type semiconductor substrate 9, a p-type region c-p-well 11 is formed, the c-p-well being enclosed by an n-type region 10 to electrically isolate the c-p-well from the p-type substrate. The n-type region 10 is connected to a c-p-well line made of a first metal M0 via a conductor filling the first contact hole (CB) and an n-type diffusion layer 12. The p-type region c-p-well 11 is also connected to the c-p-well line via the first contact (CB) and a p-type diffusion layer 13. The c-p-well line is connected to the c-p-well control circuit 5 (FIG. 1).

Each memory cell has a floating gate (FG) that stores an amount of charge corresponding to the data being stored in the cell, the word line (WL) forming the gate electrode, and drain and source electrodes made of the n-type diffusion layer 12. The floating gate (FG) is formed on the surface of the c-p-well via a tunnel oxide film (14). The word line (WL) is stacked on the floating gate (FG) via an insulator film (15). The source electrode is connected to the common source line (c-source) made of the first metal (M0) via the second select transistor (S) and the first contact hole (CB). The common source line is connected to the c-source control circuit (4). The drain electrode is connected to the bit line (BL) made of a second metal (M1) via the first select transistor (S), the first contact hole (CB), an intermediate wiring plate of the first metal (M0) and a second contact hole (VI). The bit line is connected to the column control circuit (2).

Figure 4:
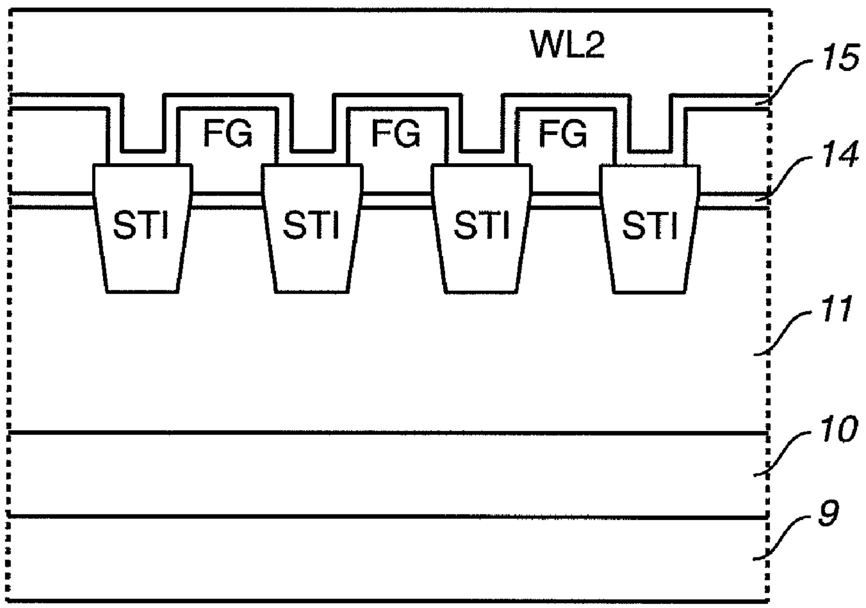
FIG. 4 is a cross-sectional view of the memory array of FIG. 3, taken at section 4-4 thereof.
Figure 5:
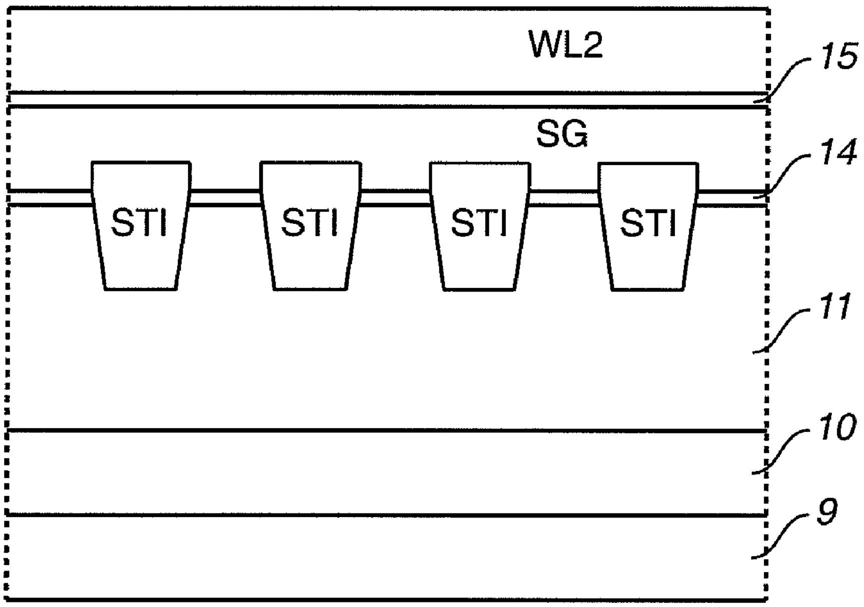
FIG. 5 is a cross-sectional view of the memory array of FIG. 3, taken at section 5-5 thereof.

FIGS. 4 and 5 show cross sectional views of a memory cell (section 4-4 of FIG. 3) and a select transistor (section 5-5 of FIG. 3), respectively, in the direction of the word line (WL2). Each column is isolated from the neighbor columns by a trench formed in the substrate and filled with isolation material, known as shallow trench isolation (STI). The floating gates (FG) are isolated from each other by the STI and insulator film 15 and word line (WL). The space between the floating gates (FG) may be of the order of 0.1 um, and the capacitive coupling between the floating gates may be significant. Since the gate electrode (SG) of the select transistor is formed in the same formation process steps as the floating gate (FG) and word line (WL), it shows a stacked gate structure. These two layers forming the select gate lines (SG) are electrically shorted together using one contact for each select gate, as in the STI embodiment the poly 1 layer is etched into isolated strips during the STI definition. When the word lines are etched, poly 1 strips are also etched, leaving the poly 1 gates residing above select gate channels as isolated conductors. However, poly-2 layer will form a conducting line, connecting the individual poly-1 select gates to each other in order to form the select gate lines, which extend in a parallel direction to word lines.

Table I of FIG. 6 summarizes voltages applied to operate the memory cell array 1, in a specific example, each memory cell's floating gate storing two bits, having one of the states "11", "10", "01", "00". This table shows the case where the word line "WL2" and the bit lines of "BLe" are selected for reading and programming. By raising the c-p-well to an erase voltage of 20V and grounding the word lines (WL) of a selected block, the data of the selected block is erased. Since all of the word lines (WL) of the unselected blocks, bit lines (BL), select lines (SG) and c-source are put in a floating state, these are also raised to an intermediate voltage of, for example, 8V due to a capacitive coupling with the c-p-well. Therefore, a strong electric field is applied to only the tunnel oxide films 14 (FIGS. 4 and 5) of the selected memory cells (M), and the data of the selected memory cells are erased as a tunnel current flows across the tunnel oxide film 14. The erased cell is, in this example, one of the four possible states, namely "11".

In order to store electrons in the floating gate (FG) during a programming operation, the selected word line WL2 is connected to a program pulse Vpgm and the selected bit lines BLe are grounded. On the other hand, in order to inhibit the program on the memory cells (M) in which programming is not to take place, the corresponding bit lines BLe are connected to a positive voltage Vdd, for example 3V, at the onset of programming, in order to isolate their string channels and have them float up to an inhibit condition as mentioned earlier. This program inhibit is also done on all of the unselected bit lines BLo. The unselected word lines WL0, WL1 and WL3 are connected to 10V, the first select gate (SGD) is connected to Vdd, and the second select gate (SGS) is grounded. As a result, a channel potential of the memory cell (M) that is being programmed is set at 0V. The channel potential of a cell that is being inhibited is raised to around 8V as a result of the channel potential being pulled up by the capacitive coupling with the word lines (WL). As explained above, a strong electric field is thus applied to only the tunnel oxide films 14 of the memory cells (M) during programming, and the tunnel current flows across the tunnel oxide film 14 in the reverse direction compared to the erase, and then the logical state is changed from "11" to one of the other states "10", "01", or "00". Various other coding schemes may be selected to represent these states so that the designation E (erase), A (lowest threshold program state), B (threshold higher than A), and C (highest threshold program state) will be used in the subsequent discussion.

In the read and verify operations, the select gates (SGD and SGS) and the unselected word lines (WL0, WL1, and WL3) are raised to a read pass voltage of 4.5V to insure that current between the bit line and common source line can pass through them. The selected word line (WL2) is connected to a voltage, a level of which is specified for each read and verify operation in order to determine whether a threshold voltage of the concerned memory cell has reached such level. For example, in a READ 10 operation (state A), the selected word line WL2 is grounded, so that it is detected whether the threshold voltage is higher than 0V. In this read case, it can be said that a read level is 0V. In a VERIFY01 operation (state C), the selected word line WL2 is connected to 2.4V, so that it is verified that whether the threshold voltage has reached 2.4V. In this verify case, it can be said that a verify level is 2.4V.

The selected bit lines (BLe) are pre-charged to a high level, for example 0.7V. If the threshold voltage is higher than the read or verify level, the potential level of the concerned bit line (BLe) maintains the high level, because of the non-conductive memory cell (M). On the other hand, if the threshold voltage is lower than the read or verify level, the potential level of the concerned bit line (BLe) decreases to a low level, for example less than 0.5V, because of the conductive memory cell (M). Further details of the read and verify operations are explained below.

Figure 7:
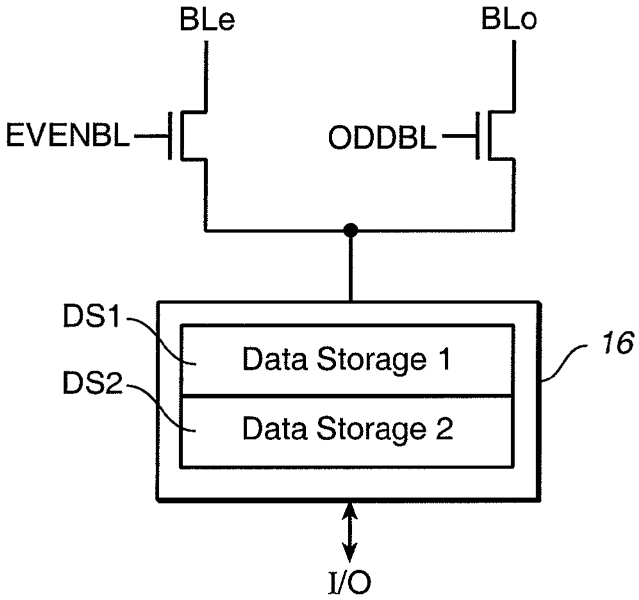
FIG. 7 illustrates another feature of the NAND memory cell array of FIGS. 2-5.

FIG. 7 shows a part of the column control circuit 2 of FIG. 1. Each pair of bit lines (BLe and BLo) is coupled to a data storage portion 16 which includes two data storage (DS1 and DS2) registers, each being capable of storing one bit of data. The data storage portion 16 senses the potential level of the selected bit line (BL) during a read or verify operation and then stores the data in a binary manner, and controls the bit line voltage in the program operation. The data storage portion 16 is selectively connected to the selected bit line (BL) by selecting one of signals of "EVENBL" and "ODDBL". The data storage portion 16 is also coupled to the I/O line to output the read data and to store the program data. The I/O line is connected to the data input/output buffer 6, as described above with respect to FIG. 1.

Operation of the Memory System with More than Two States Per Storage Element

Figure 8:
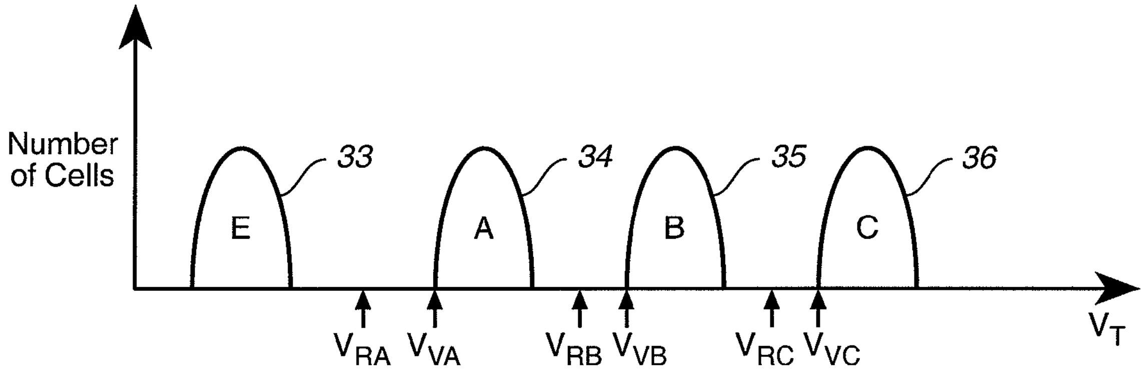
FIG. 8 shows an example of an existing distribution of threshold voltages of the NAND memory cell array of FIGS. 2-5 when operated in four states.

FIG. 8 illustrates threshold voltage distributions for the memory cell array 1 when each floating gate storage element stores two bits of data, namely four data states, in each memory cell (M). The curve 33 represents a distribution of the threshold levels $V_T$ of the cells within the array 1 that are in the erased state (E data state), being negative threshold voltage levels. Threshold voltage distributions 34 and 35 of memory cells storing A and B user data, respectively, are shown to be between $V_{VA}$ and $V_{VB}$ and between $V_{VB}$ and $V_{VC}$. A curve 36 shows the distribution of cells that have been programmed to the C data state, being the highest threshold voltage level set more than 2V and less than 4.5V of the read pass voltage.

In this example, each of the two bits stored in a single memory cell (M) is from a different logical page. That is, each bit of the two bits stored in each memory cell carries a different logical page address from the other. The lower page bit shown in FIG. 8 is accessed when an even page address (=0, 2, 4, . . . , N/2) is input where N is the logical page capacity of the memory. The upper page bit is accessed when an odd page address (=1, 3, 5, . . . , [N/2]+1) is input. Using the example coding shown in FIG. 8, state E can be represented as the "11" state, state A as the "10" state, state B as the "00" state, and state C as the "01" state, where the first binary digit represents the value stored in the upper page and the second binary digit represents the value stored in the lower page. Note that the even and odd page addresses should not be confused with even and odd bit lines.

In order to provide improved reliability, it is better for the individual distributions to be tightened (the threshold distribution narrowed), because the tighter distribution results in a wider read margin (distance between them). According to the present invention, the distribution width remains tighter without a conspicuous degradation in the programming speed.

Figure 9A:
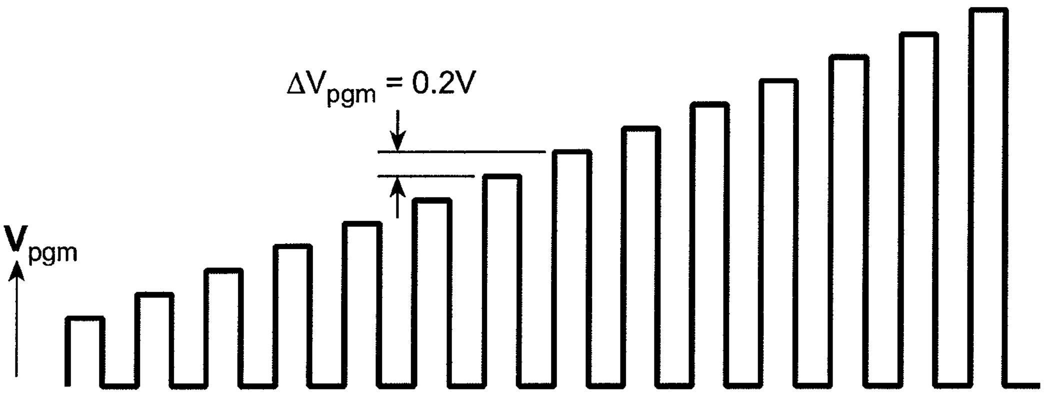
FIGS. 9A and 9B show an example programming voltage signal that may be used in the memory cell array of FIGS. 2-5.

According to the article "Fast and Accurate Programming Method for Multi-level NAND EEPROMs", *Digest of* 1995 *Symposium on VLSI Technology*, pp 129-130, which article is incorporated herein by this reference, in principle, limiting a distribution to a 0.2V-width requires that the usual repetitive programming pulses be incremented 0.2V between steps. FIG. 9A shows an existing programming pulse technique. A programming voltage Vpgm waveform is illustrated. The programming voltage Vpgm is divided into many pulses, and increased 0.2V pulse by pulse. The starting level of Vpgm is 12V, in this particular example.

Figure 9B:
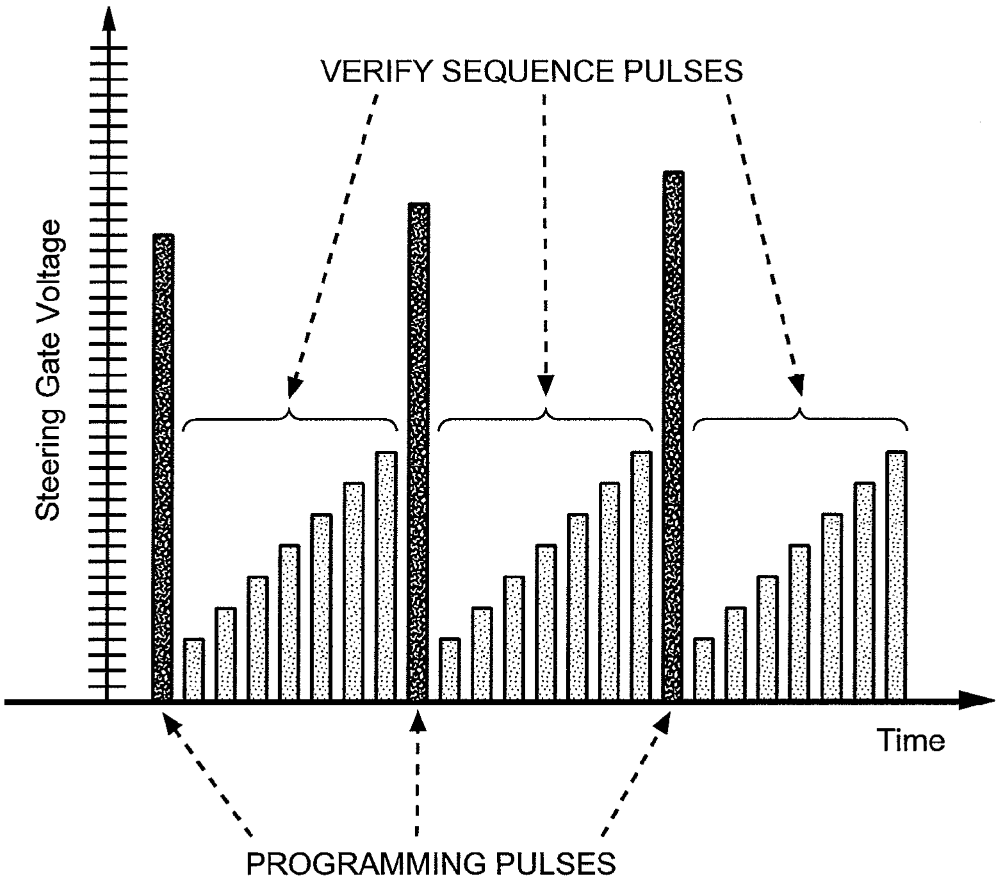

In periods between the pulses, the verify (read) operations are carried out. That is, the programmed level of each cell being programmed in parallel is read between each programming pulse to determine whether it is equal to or greater than the verify level to which it is being programmed. This is shown in FIG. 9B, which is a more detailed version of FIG.

9A, for a memory storing four bits per cell. If it is determined that the threshold voltage of a given memory cell has exceeded the verify level, programming is stopped or inhibited for that bit by raising the voltage of the bit line to which the series cell unit of the given cell is connected from 0V to Vdd. Programming of others of the cells being programmed in parallel on the same page continues until they in turn reach their verify levels. When the threshold voltage moves from below the verify level to above it during the cell's last programming pulse, the shift of the threshold voltage is equal to the Vpgm step size of 0.2V. Therefore, the threshold voltages are controlled within a 0.2V-width.

One specific existing technique of programming a 4-state NAND memory cell in an array of the type described above is now described. In a first programming pass, the cell's threshold level is set according to the bit from the lower logical page. If that bit is a "1", nothing is done since it is in that state as a result of having been earlier erased. However, if that bit is a "0", the level of the cell is increased to the A programmed state 34 using $V_{VA}$ as the verify voltage to inhibit further programming. That concludes the first programming pass.

In a second programming pass, the cell's threshold level is set according to the bit being stored in the cell from the upper logical page. If a "1", no programming occurs since the cell is in one of the states 33 or 34, depending upon the programming of the lower page bit, both of which carry an upper page bit of "1". If the upper page bit is a "0", however, the cell is programmed a second time. If the first pass resulted in the cell remaining in the erased or E state 33, the cell is programmed from that state to the highest threshold state 36 (state C), as shown by the upper arrow FIG. 8 and $V_{VC}$ is used as the verify condition to inhibit further programming. If the cell has been programmed into the state 34 (state A), as a result of the first programming pass, the cell is further programmed in the second pass from that state to the state 35 (state B) using $V_{VB}$ as the verify condition, as shown by the lower arrow of FIG. 8. The result of the second pass is to program the cell into the state designated to store a "0" from the upper page without changing the logical value written during the first pass programming. During this second programming cycle, the threshold distribution of a cell can remain in state E or A, or shift into either state B or C. Since there are two different target threshold states occurring in different cells simultaneously during the same programming cycle, two different verify levels, $V_{VB}$ and $V_{VC}$, must be checked after each programming pulse. In some systems $V_{VC}$ may be checked only during the later voltage pulses in order to speed up the total program cycle.

Of course, if the memory is operated with more than four states, there will be a number of distributions within the defined voltage threshold window of the memory cells that is equal to the number of states. Further, although specific bit patterns have been assigned to each of the distributions, different bit patterns may be so assigned, in which case the states between which programming occurs can be different than those described above. A few such variations are discussed in the patents previously referenced in the Background for NAND systems. Further, techniques for reducing the consequences of adjacent cell coupling in NAND and other types of memory arrays that are operated in multiple states are described in U.S. Pat. No. 6,522,580, which is also incorporated herein in its entirety by this reference.

The voltages $V_{RA}$, $V_{RB}$ and $V_{RC}$, positioned roughly halfway between adjacent ones of the distributions 33-36, are used to read data from the memory cell array. These are the threshold voltages with which the threshold voltage state of each cell being read is compared. This is accomplished by comparing a current or voltage measured from the cell with reference currents or voltages, respectively. Margins exist between these read voltages and the programmed threshold voltage distributions, thus allowing some spreading of the distributions from disturbs and the like, as discussed above, so long as the distributions do not overlap any of the read voltages $V_{RA}$, $V_{RB}$ and $V_{RC}$. As the number of storage state distributions increases, however, this margin is reduced and the programming is then preferably carried out with more precision in order to prevent such spreading.

The previous description assumes that two logical pages reside in one physical page and that only the lower logical page or the upper logical page but not both are programmed during a given programming cycle. U.S. patent application publication US 2003/0112663 titled "Method and System for Programming and Inhibiting Multi-Level Non-Volatile Memory Cells", hereby incorporated by reference, describes programming all of the physical states of the page during one programming operation. In the case of four states per cell as shown in FIG. 8 all cells that will be programmed to any of the program states A, B, or C are first programmed to state A as described previously. After all cells to be programmed to any of these states are verified to have reached state A and since data for the upper states B and C already exist in the data latches DS1 and DS2 of FIG. 7, the programming cycle can continue without interruption or reloading of new data, and cells that should be programmed to states B and C can continue programming into state B. Once all cells reach this level, only those cells needing to C can continue into that state. As described in that patent application, it is observed that some bits ("fast bits") program faster than others ("slow bits") and in practice some reduction in the wordline voltage is desirable when transitioning from programming into state B from state A and similarly from state B to state C.

Although a specific programming scheme has been described, there are other possibilities that can be used. For example, U.S. Pat. No. 6,046,935 describes a programming method in which selected cells are programmed from state E to state B during a first programming cycle. During a second programming cycle cells are programmed from state E to state A and from state B to state C. U.S. Pat. No. 6,657,891 elaborates on this method by teaching that the initial distribution of state B may be allowed to extend to a lower threshold limit and even overlap final state A at the end of the first programming cycle, being tightened to its distribution only during the second programming cycle. Furthermore, the binary coding adopted to represent states E, A, B and C may be chosen differently that that shown in FIG. 8. Both U.S. Pat. Nos. 6,046,935 and 6,657,891 are hereby incorporated by reference.

Alternate Verify and Read Techniques

As noted in the Background, it is desirable to improve the performance of multi-state non-volatile memories. The present section is addressed to improving sensing operations, such as occur during read operations and the verify phase of the program operations. As described above with respect to FIG. 9B, each program pulse is normally followed by as many as (N−1) verify operations each of which applies a different value of control gate voltage to the selected word line, where N is the number of states in an MLC embodiment. For example, with 4 storage states per cell corresponding to 2 bits per cell, every program pulse is typically followed by 3 verify read operations. Each of these verify operations is typically at a successively higher read voltage applied to the selected word line. Although the following techniques may all be implemented in binary memories, their advantages are most fully realized in multi-state applications.

In sensing a non-volatile memory cell, whether as part of a read operation or as part of the verify phase of a program operation, there will typically be several phases. These include applying voltages to the cell so that it is biased appropriately with the correct initial conditions for its data content to be sensed or measured, followed by an integration period that measures a parameter related to the state of the cell. In an EEPROM cell, the parameter is usually a voltage or the source-drain current, but can also be a time or frequency that is governed by the state of the cell. An example of one embodiment for the sense voltages of this measurement process is shown schematically in FIG. 10.

Figure 10:
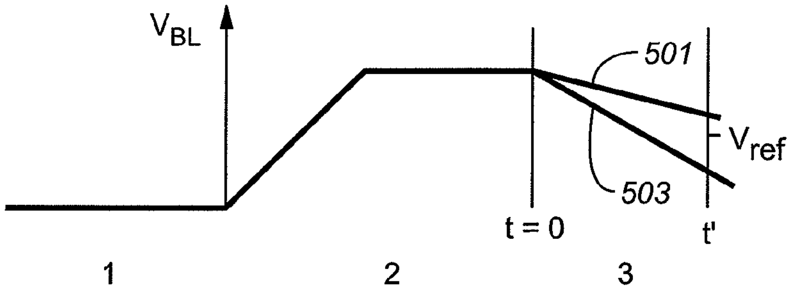
FIG. 10 illustrates a dynamic sensing technique based upon discharging a selected memory element.

FIG. 10 shows the voltage level on a bit-line of a memory array, for example one of the bit lines shown in FIG. 2. The first phase sets the gate voltages on the cells. In the second phase, the bit-lines of the cells to be read are charged up to a predetermined level. The integration time is the third phase, beginning at a time t=0, when the bit line discharges through the cell and the voltage level decays at a rate dependent on the state of the cell. After a time t=t', the voltage level on the bit-line is measured relative to a reference level $V_{ref}$. If the voltage is at or above $V_{ref}$, as in line 501, the cell is considered in an off state. If the voltage is below $V_{ref}$, as in line 503, the cell is considered in an on state and that, consequently, the voltage on the control gate is above the threshold voltage of the cell. This technique, along with other methods of reading memory cells, are described further in U.S. Pat. Nos. 6,222,762, 6,538,922, and 6,747,892, all of which are hereby incorporated by reference, and in references contained in these applications.

The use of the sensing technique requires a balance in the choice of t' and the reference voltage, $V_{ref}$, used to the sense the state of the cell: if t' is taken too short, 501 and 503 will not have sufficiently separated, while if t' is taken too long, 503 and 501 will have bottomed out at ground; similarly if $V_{ref}$ is taken too high, even an off cell may be mistakenly read as on due to low level leakage currents, while if $V_{ref}$ is taken too low, even an on cell may be mistakenly read as off since on cells can carry a finite amount of current. (Note that the question to be determined is whether the applied control gate voltage, $V_{CG}$, is above or below the cell threshold and, since this is not known before the measurement is made, there is no $V_{CG}$ within the range of values which is, a priori, too high or too low; i.e. the application of different $V_{CG}$ values is not a mistake, but choosing an inappropriate t', or $V_{ref}$ is a mistake). This problem is aggravated in multi-state memories where closely lying levels must be differentiated. Consequently, this is typically implemented by a precharge and discharge (and corresponding $V_{ref}$) for each state or target value.

As shown in FIG. 9B, during a multi-state programming operation, such a read process would need to be performed to verify the state of the memory cell against each target state. In order to increase write performance by somewhat reducing the number of verify operations that follow each program pulse, during the first few programming pulses, those verify operations which apply higher control gate voltages may be skipped, and during the last few program pulses those verify operations which apply lower control gate voltages may also be skipped. This skipping can be done more intelligently, more safely, and more efficiently by keeping track of the highest programmed and the lowest programmed cell in each write block at any given time during the programming operation, as the distribution of VT's is stair-cased with each higher voltage program pulse applied to the selected control gate. For example, a verify operation for state 3 can be skipped for as long as no cell has yet verified for having reached state 2. Such a "smart verify" technique is described in U.S. patent-publication 2004-0109362-A1, published Jun. 10, 2004 and which is hereby incorporated by reference. Although the preceding describes the way in which the verify operation has been done in the past and improvements to make it more efficient, it still requires multiple verify operations between pulses. The inventive concept of the present invention improves upon this situation.

When applied to the writing process, a principle aspect of the present invention replaces the (N−1) (or somewhat fewer) verify operations per program pulse with only a single verify operation. This is achieved by applying a single, fixed, high valued read voltage (e.g. 2.4V which is the typical word line voltage for discriminating between the highest programmed threshold state and the other lower programmed states) to the selected word line, and simultaneously verifying each cell against its own target state by taking advantage of the body effect in the following manner: A voltage of, for example, 2V is applied to the traditional source line of the NAND array (FIG. 2), while SGS transistors are turned on, in order to transfer this voltage to the traditional source sides of the NAND strings in the selected block. The traditional drains (i.e. the bit lines) are discharged to ground before the beginning of the signal integration period by grounding the bit lines and applying a sufficiently high voltage to SGDs in order to guarantee that all bit lines are pre-discharged. During the integration period those cells which are initially conductive will experience a rise in their respective bit line voltages until each cell reaches its threshold voltage and shuts off the further charging of the its respective bit line, after which point the bit line voltage will not substantially rise any further. It is important to note that the bit lines are playing the role of the source for the memory cell, and as such, the threshold voltage of each memory cell will be a function of the source voltage through the body effect. This is illustrated schematically in FIG. 11.

Figure 11:
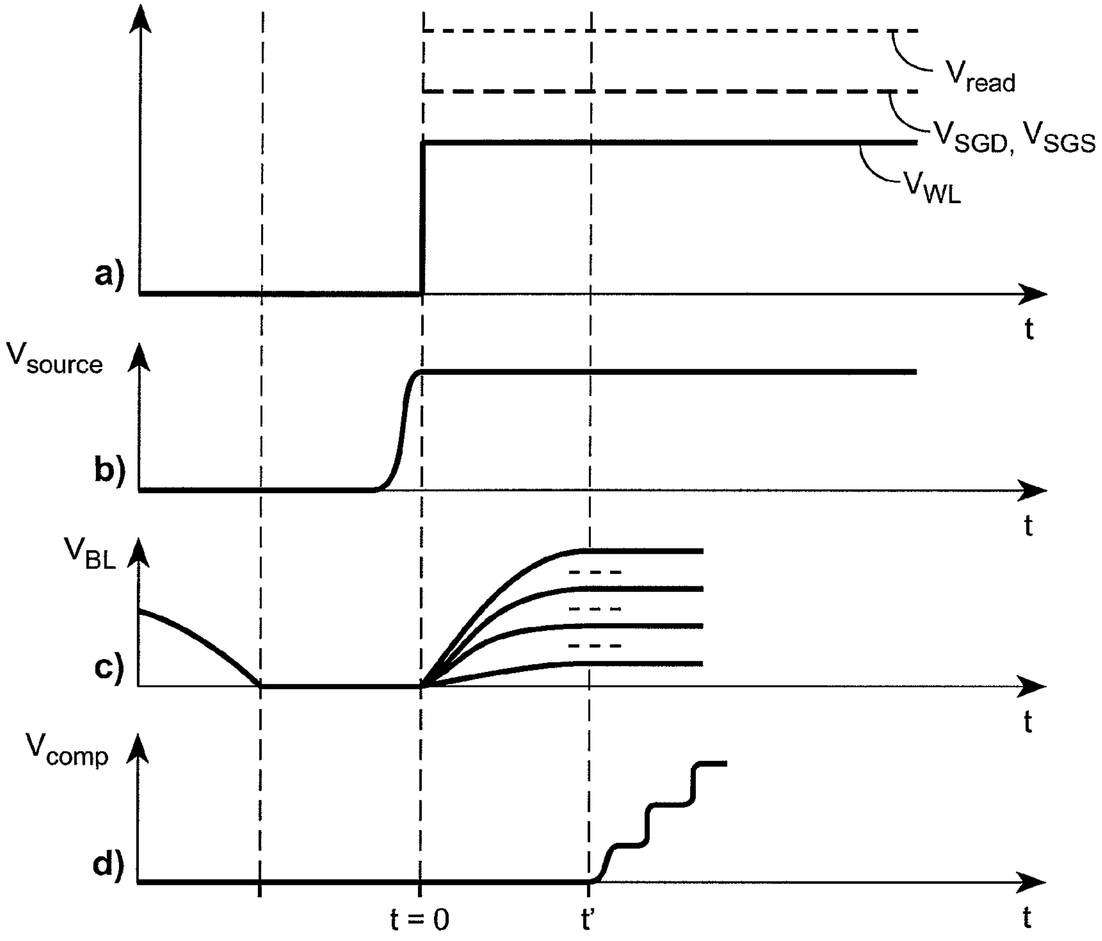
FIG. 11 illustrates a sensing technique according to an exemplary embodiment of the present invention.

FIG. 11 shows voltage levels for the bit line (FIG. 11C) in response to the sensing operation, along with the voltage $V_{WL}$ supplied by the word line to the control gates of the cells in the selected row (FIG. 11A), the voltage supplied to the common source line of the select cells (FIG. 11B), and the reference levels (FIG. 11D) for the case where three of these are supplied sequentially to reference voltage input side of the sense amplifiers through a single reference voltage carrying bus line. FIGS. 11A-C therefore respectively represent the voltage at the control gate ($V_{WL}$), source ($V_{source}$), and drain ($V_{BL}$) of selected storage elements. Various details of NAND array operations which can be incorporated into the exemplary embodiments can be found in the following US patents and patent publications, all of which are hereby incorporated by reference: U.S. Pat. Nos. 6,373,746; 5,570,315; 5,652,719; 5,521,865; 5,870,334; 5,949,714; 6,134,140; 6,208,560; 6,434,055; 6,549,464; 6,798,698; 20050013169; U.S. Pat. Nos. 5,969,985; 6,044,013; 6,282,117; 6,363,010; and 6,545,909.

In addition to the control gate, source and drain voltages for the selected element, for a NAND embodiment the other voltages needed on a NAND string need to be set: the other storage elements in the string will need to be turned fully, the drain side select gate (SGD) will need to be turned on, at the latest, by the beginning of the pre-charge (or, more accurately, the pre-discharge) phase, and the source side select gate (SGS) will need to be turned on, at the latest, by time t=0. The relative values for these other voltages after t=0 are shown schematically by the broken lines on FIG. 11*a*. $V_{SGS}$, $V_{SGD}$, and $V_{READ}$ respectively correspond the source side select gate voltage, the drain side select gate voltage, and the voltage applied to the non-selected word lines in the block during the read operation. For example, $V_{SGS}$ and $V_{SGD}$ can be at 5V just to guarantee that these transistors are on, despite the body effect, $V_{WL}$ can be 3.5V (or whatever the highest $V_{TH}$ comparison voltage is), and $V_{READ}$ is higher than $V_{WL}$. $V_{READ}$ is also taken higher than the usual 5V (e.g. 7V) so that all the other cells along the NAND strings will be "on" in spite of their body effected elevated thresholds and their potentially being in the highest program state.) (There values prior to t=0 are discussed but not explicitly illustrated as there are several options here.) These values, particularly the last, will be discussed further in the following.

FIG. 11 begins in an initial state, phase 1, corresponding to what ever process had previously been going on. $V_{BL}$ is shown to have some initial value and all of the others are shown low, but this is just an arbitrary starting point. Phase 2 is the pre-charge (more accurately pre-discharge) phase where the bit line is taken to ground to set the initial condition in preparation for the sensing process of phase 3 that begins at t=0. In a NAND array, the drain side select transistor (SGD) is turned on to allow the charge to flow out and held on through out the process, allowing the bit line to charge back up in phases 3 and 4. Prior to time t=0 the source line will be charged up, so that when the cell is turned on, current can flow in to charge up the bit line according to the state of the cell. At time t=0 the word line voltage $V_{WL}$ is raised, allowing the bit lines to charge up in phase 3. During phase 3 the bit lines which were held at ground prior to t=0, are disconnected from ground and left to float, allowing them to charge up to higher voltages depending on the cell current.

As shown in FIG. 11C, once the word line is taken high at t=0, the bit lines begin to charge up. As the same $V_{WL}$ is applied to all cells along the word line, all cells of the read set (or read page) will charge up. Consequently, this would be for either all of the even or odd bit lines in the sort of architecture described in many of the NAND references cited above and in U.S. patent application Ser. No. 10/751,097, filed Dec. 31, 2003, and which is hereby incorporated by reference, or all of the bit lines in the all bit line, or ABL,-type architecture described in U.S. patent application Ser. No. 10/254,483 filed Sep. 24, 2002, which is hereby incorporated herein by reference. In alternate embodiments, both the source voltage $V_{CS}$ and the word line voltage $V_{WL}$ could be raised prior to t=0, with one of the select lines used to turn on the process at t=0.

As the same $V_{WL}$ is applied to all cells, a given cell's bit line will charge up at a rate and, due to the body effect, towards an asymptotic voltage value based upon the data state stored on the cell. This is shown for a four state cell along the time axis of FIG. 11C during phase 3. As these bit line voltages begin to separate, the different data states can then be distinguished. At some time t' the $V_{BL}$ values can be compared against reference values. Although reading sooner after t=0 can decrease the read time, it may also result in more inaccuracy as the values are still rising; consequently, it is generally preferable to improve accuracy by waiting until the values begin to level off at or near their asymptotic values. Even though this may be somewhat slower than beginning to read sooner, it will still be faster than the sort of discharge method described above with respect to FIG. 10, as only a single bit line charging process is needed to read all data states. Unlike the sort of dynamic read based on the cells discharge rate, in the process of FIG. 11 all states can be sensed simultaneously as the bit line values will each level off to a different value dependent on the measured cell's state. In contrast, the dynamic sensing of FIG. 10 will need to go through a full charge-discharge cycle for each different comparison point.

Figure 12:
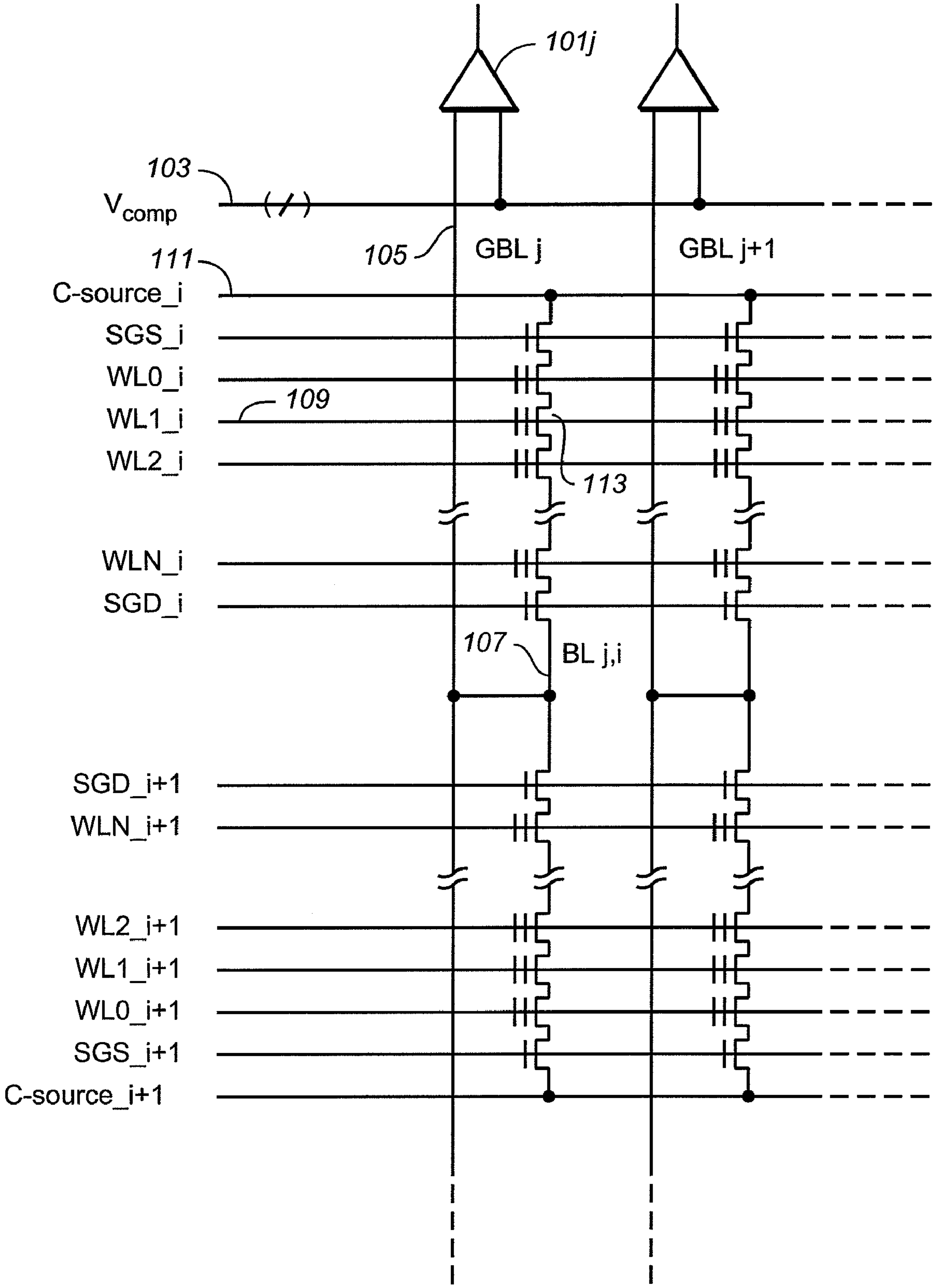
FIG. 12 shows a portion of a memory array and peripheral circuitry according to the present invention.

At t=t', the level on each bit line can be compared to multiple reference values concurrently or sequentially during the read process of phase 4. FIG. 12 schematically shows a portion of the array and peripheral circuitry for one embodiment.

FIG. 12 shows a portion of two blocks of an array in an all bit line (ABL) arrangement. As shown, block i is flipped with respect to block i+1 in the sense that the common source line for block i, c-source_i 111, is at the top of bock i above the select gate line SGS_i, which is in turn above the memory cells, whereas block i+1 is arranged with it common source line, c-source_i+1, at the bottom. Consider the case where the memory cells along word line WL1_i 109 are to be read. In this case the voltage $V_{WL}$ of FIG. 11A is applied to WL1_i 109 and the voltage of FIG. 11B is applied to c-source_i 111, with the non-selected word lines and the select gates on the source and drain sides turned on no later than t=0. In this and the following figures, the sense amplifier circuits are all shown to be on the upper side of the array for simplicity of representation. In actually implementations, the circuitry for alternate bit lines may be located on the bottom side of the array, such as is described in U.S. patent application Ser. No. 11/078,173 filed Mar. 11, 2005, and which is hereby incorporated by reference.

All of the NAND strings in a selected read page will have the same $V_{source}$ and same $V_{WL}$ applied, as they also will for the rest of voltages associated with the selected NAND block (to the non-selected word lines and the select gates): what differs is the charge stored on the floating gates of cells of the selected row, which will determine how fast and how far the voltage level on the corresponding bit line will rise, corresponding to the differing lines of FIG. 11C. For example, on the cell 113 on bit line j, this will control the level on bit line BLj 107, which is then communicated along global bit line GBLj 105 to the corresponding comparator 101*j*. The comparison values are supplied to the comparators along line (or lines) 103. While these different comparison values are supplied and stabilized on line(s) 103 at earlier times, the comparison operation can be performed during phase 4 after time t', as shown in FIG. 11D. As discussed below with respect to FIG. 13, line 103 can either be a single line with the different comparison values ($V_{comp}$) supplied sequentially or separate lines for the various comparison values that are then multiplexed into the comparators. In another variation, the level of each of the global bit lines can be supplied to multiple comparators for comparison to the different $V_{comp}$ values in parallel.

The advantages of sensing all levels concurrently include a gain in performance due to parallelization of the comparison operations. However, concurrent sensing of all levels entails a penalty in terms of area and complexity of the sense amplifiers, where each sense amplifier would include (N−1) comparators. In addition, (N−1) bus lines will be required to deliver the (N−1) reference voltages required for concurrently sensing and distinguishing N states from one another. Alternatively, if the compare operations are performed sequentially then the sense amplifiers can be designed to be much simpler and occupy smaller portions of the die. It should be noted that in the typical ABL architecture, every global bit line has a dedicated sense amplifier, and in the more conventional odd/even sensing, one sense amplifier is dedicated to every global bit line pair. Another advantage of performing the comparison phase in a sequential manner is that a single bus line running in the same direction as the word lines can be used for delivering the reference voltages in a time multiplexed manner to all sense amplifiers residing at the end of each memory plane. This also saves die area. However there will be some performance and power/energy penalties associated with charging the reference bus line voltage (N−1) times. It is also possible to design the memory to time multiplex the compare operations, but to do so using several reference voltages bus lines. Combinations are also possible where, for example, an 8 state memory (N=8) could have 4 bus lines, and the sense amps can be designed to each concurrently sense 2 states using two of the reference bus lines while the other 2 reference bus lines are charging to the next pair of reference voltages, reducing the performance impact of the reference bus lines' charging time. It is important to note that the bit line charging or discharging phase is a relatively slow process, taking on the order of several microseconds. This time is dictated by the formula I=C dV/dt, where I is the current which can be no bigger than the memory cell transistor's saturation current (for an on cell, a typically value for I is on the order of a micro-amperes or less), C is typically the bit line capacitance, which is usually dominated by the global bit line capacitance, and dV is the minimum change in sensing node voltage required for a reliable, and noise-free operation, and it is in the range [50 mV, 500 mV]. U.S. patent publications US-2005-0169082-A1 and 2004-0057318-A1, which are hereby incorporated by reference, describes the use of a sensing node that is not the global bit line in, for example, the ABL architecture; consequently, this sort of arrangement allows faster sensing since the capacitance of the sensing node is considerably smaller than the global bit line capacitance. The compare operation which compares the sensing node voltage with the reference voltage is a very fast operation which may take only a few nano-seconds, or tens of nano-seconds. These exemplary numbers are provided to illustrate the point that performance is increased by going from (N−1) sequential sensing operations to using, for example, a single sensing operation which may utilize up to (N−1) sequential compare operations.

The discussion so far mainly looked at the case of four state memory cells, each storing 2-bits of data. However, when even more states are stored on each cell, it may not be possible to differentiate all of the states by using a single word line voltage. Even if it is possible to discriminate all of the possible data states, whether there be three, four, or more such states, it may be preferable to break the process up into more than one read. For example, to differentiate all states at once may require bias conditions that would produce an high number of read disturbs. To be able to read multiple data states by using the same word line voltage and varying amounts of body effect delivered from the bit lines, the VREAD voltage applied to the non-selected word lines of a NAND block will have to be overdriven by a higher amount than that needed for conventional reading of NAND memories. A higher VREAD value should be selected that enables the turning on of memory cells that have been programmed to the highest threshold voltage and who are now being read by having a positive source bias which will further raise their high threshold values. Consequently, higher VREAD values may be necessary. These high VREAD values can lead to read disturb. To alleviate this issue read scrubbing (such as is described in U.S. Pat. No. 5,532,962, which is hereby incorporated by reference) can be performed at a frequency that guarantees that no block will experience enough read disturb exposure before its data is rewritten. This rewriting of the data can be performed by moving the data to another block as is done in wear leveling schemes (such as described in U.S. Pat. No. 6,230,233, publication number US-2004-0083335-A1, and application Ser. Nos. 10/990,189 and 10/281,739, all of which are hereby incorporated by reference). It is also possible to design a hybrid sensing scheme where (N−1) sensing operations are performed in M (M<N) sequential sensing operations, where each of the M operations requires discharging/charging of the sense nodes. This hybrid scheme may be employed to alleviate the issues that may arise from the lack of availability of dynamic range in allowed source/drain voltages, where the magnitude of the body effect, together with disturb and reliability issues may necessitate the breaking down of a single verify for all (N−1) compares into more than a single verify operation. Although such a hybrid sensing scheme requires combining two seemingly contrary approaches (using multiple word line read voltages, but also sensing multiple states at a time by charging the cells up through their sources), it can be quite advantageous in multi-state applications as described below with respect to FIG. 14.

The following set of exemplary values will help elucidate this new read method: External instruments using DC biases of 0V on the source and 0.5V on the drain can measure the threshold voltage of a memory cell. A sweep of the control gate voltage will result in a drain-to-source-current vs. control-gate-voltage characteristic. A suitable current value, such as 100 nA, may be chosen to define the threshold voltage of the cell. Erased and subsequently soft-programmed cells in state E will have negative threshold values in the range −1.5V to −0.5V, cells in state A will have $V_{th}$s in the range 0.3V to 0.9V, cells in state B will have VT's in the range 1.5V to 2.1V, and cells in state C will have $V_{th}$s in the range 2.7V to 3.3V as measured by this static method. The actual memory chips typically employ dynamic sensing which involves pre-charging the bit lines (drains) before the onset of integration, and some amount of discharging of the bit line during the integration period which would indicate whether the cell being sensed is on or off. The parameters of dynamic sensing can be chosen such that a $V_{th}$ measured by the sort of dynamic sensing described above with respect to FIG. 10 will have the same value as, or a close value to the cell's $V_{th}$ measured by the static method.

Given the above distribution of threshold values, a typical read operation for a four state memory using the dynamic sensing method described above with respect to FIG. 10 will consist of 3 pre-charge and integration sequences each with the following control gate voltages: 0V, 1.2V, and 2.4V. With 0V on the control gate an ON result of the sensing operation will indicate that the cell's state is E, and an OFF result will indicate that the cell's state is A, B, or C. With 1.2V on the control gate an ON result of the sensing operation will indicate that the cell's state is E or A, and an OFF result will indicate that the cell's state is B or C. With 2.4V on the control gate an ON result of the sensing operation will indicate that the cell's state is E, A, or B, and an OFF result will indicate that the cell's state is C. The combined result of the sequence of these three sensing operations constitutes a read operation for a 4 state memory, indicating the state of each cell.

During DC sensing, and with a source voltage of 0V and a drain voltage of 0.5V the threshold voltage of a cell may be 1V. The same cell with exactly the same amount of charge on its floating gate will have a body effect shifted VT of 2.0V if the source voltage is raised to 0.5V and the drain voltage is raised to 1.0V, maintaining the same value of drain to source voltage. (In this discussion, a source body effect factor of 2 has been assumed; for other factors, the values should be adjusted accordingly.) In other words, a 0.5V increase in body bias can correspond to a 1.0V increase in cell $V_{th}$. Again, all above numerical values are exemplary only. Conventional dynamic sensing, as described with respect to FIG. 10, involves pre-charging the bit line to a high pre-charge value of, for example, 1.0V, and then releasing the bit line to allow it to either discharge down to a value of, for example, 0.4V in case of an ON cell, or only slightly droop down to, for example, 0.9V in the case of an OFF cell. At the end of the sensing integration period the bit line voltage is compared to a reference value of, for example, 0.65V in order to determine if the corresponding cell is ON or OFF. In conventional dynamic sensing, the non-selected word lines in the NAND block have to be driven to a sufficiently high $V_{READ}$ value of, for example, 5.0V in order to make sure that the cells on the non-selected word lines are not impeding the discharge of the bit line current.

For the new sensing scheme that uses the body effect to raise the VT of cells being sensed, the overdrive requirement is also increased, requiring a $V_{READ}$ that can be in excess of 7.5V. This high $V_{READ}$ value does not pose an issue during program/verify operations as the exposure to this $V_{READ}$ value is a one time exposure per block write operation. However, a read operation can be performed many times, exposing the memory cells to read disturbs that are exacerbated by higher $V_{READ}$ values which can cause excessive tunneling of charge into floating gates after multiple read operations. Read scrubbing techniques, such as those described in U.S. Pat. No. 5,532,962 can be utilized in order to remedy such read disturb issues. It should be noted that in most implementations care is taken to design the read operations to mimic the verify operation as closely as possible. This is done to increase the fidelity of the read. Therefore, one preferable embodiment consists of using the body bias single read operation not only during program/verify operations, but also during read operations.

During programming operations, the same latches that have stored the states that are to be programmed into their corresponding cells can be accessed in order to select the appropriate level of sensing trip point required for verifying the target state on a bit line by bit line basis. For example, if a cell is to be programmed to state A, then the reference trip point voltage for that cell would be (using the exemplary values from above) 1.5V, whereas programming to state B would require a trip point voltage of 1.0V, and programming to state C would require a trip point voltage of 0.5V. In one embodiment, shown in FIG. 13A, three bus lines 103*a-c*, each one carrying one of these voltages, can be designed to extend in the same direction as the word lines, allowing each bit line comparator 101 to use one of these three reference voltages through a MUX 121 whose select signals 103*d* are derived from the latches that hold the target state data corresponding to each cell/bit line.

Figure 13A:
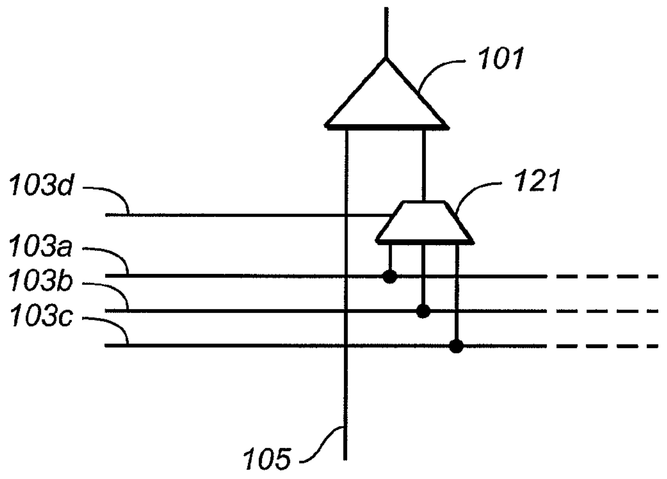
FIGS. 13A-C show variations on peripheral circuitry of FIG. 12.
Figure 13B:
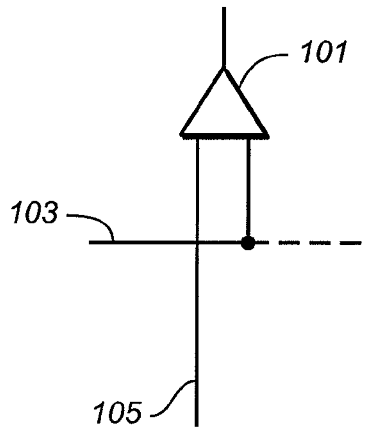

In a different embodiment, shown in FIG. 13B, one bus line 103 will sequentially carry all three voltages, and the each bit line's latch data will determine whether the valid comparison was at a time when reference voltage of 0.5V, 1.0V, or 1.5V was being applied to line 103. (As there is no latch data available during read operations, all three values will need to be compared.) In another embodiment (FIG. 13C), three comparators 101*a-c* exist for each bit line (assuming ABL architecture) or for each pair of bit lines (assuming the more conventional NAND architecture) and the bit line voltage is concurrently compared to three reference voltages. This is at the expense of the extra circuitry required to have three comparators. Alternatively, the single comparator of FIG. 13B can perform the three comparisons sequentially, affording a more compact design. The time penalty of this and other previously discussed sequential operations may be very small, as each comparison can be accomplished in a matter tens of nanoseconds, and the time it takes to change the reference bus line voltages can be very small through a properly designed bus line with small RC delay. In all these sequential embodiments the inter-state sensing delays are neither dictated by RC time constants of the array, nor by the necessary time to pre-charge or sense. This is in contrast to inter-state sensing delays of existing embodiments where the recharge-discharge processes take appreciably longer.

As noted above, for cells storing many states, there may be enough dynamic range in allowed source/drain voltages such that the magnitude of the body effect, together with disturb and reliability issues, allow all of the states to be determined in a single sensing operation. For example, consider the case of where the memory cells in the process of FIG. 11 store 8 states, or 3-bits, per memory cell. For the shown $V_{WL}$ values, the shown states in 11*c* may only be the 0, 1, 2, and 3 states, with $V_{WL}$ being too low to turn on cells in the higher states (4, 5, 6, and 7); or if $V_{WL}$ is sufficiently high to turn on cells in these higher states, all of the states 0, 1, 2,and 3 may top out at the upper curve.

To overcome this lack of dynamic range, in a further aspect, the present invention employs a hybrid sensing technique. In these embodiments, multiple $V_{WL}$ values are used, but each according to the method described with respect to FIG. 11, with the cells discharged, allowed to charge up through the source, and then having multiple states sensed. For each $V_{WL}$ value, a subset of the totality of multi-states are sensed, so that, when the separate sensing sub-operations are completed, sensing has been completed for all of the states. Consequently, all of these subsets will typically be distinct, in that although they may have some states in common, they will differ in at least some members. Although greater efficiency would follow from non-overlapping subsets, in some implementations it may be easier to allow some overlap for additional accuracy and to ensure no states are missed. Additionally, there may be cases where the highest or lowest subsets are contained entirely within a larger, adjacent subset.

It should be noted that the hybrid approach is combining two somewhat antithetical techniques: the technique of FIG. 11 eliminates the need for switching word line voltages for reading, allowing all states (in the 4-state case for FIG. 11) to be sensed at once with the complexity of multiple read voltages. In contrast, the more common multiple word line voltage method assigns the usual role to the source and drain sides of the memory cell and can eliminate the more involved operation of switching the source and drain polarities, to engage the body effect. To combine both methods, may at first seem to be over-complicating the sensing scheme. But the consideration of allowed $V_{READ}$ voltages as dictated by read disturb concerns may make the hybrid approach the best compromise between 1) having a high threshold window that can support multi-state memory, 2) a low enough VREAD to reduce read disturb down to scrub manageable levels, and 3) gain in performance obtained by the application of multiple source side voltages that raise threshold voltages through body effect and allow concurrent verify operations of multiple data states.

Figure 14:
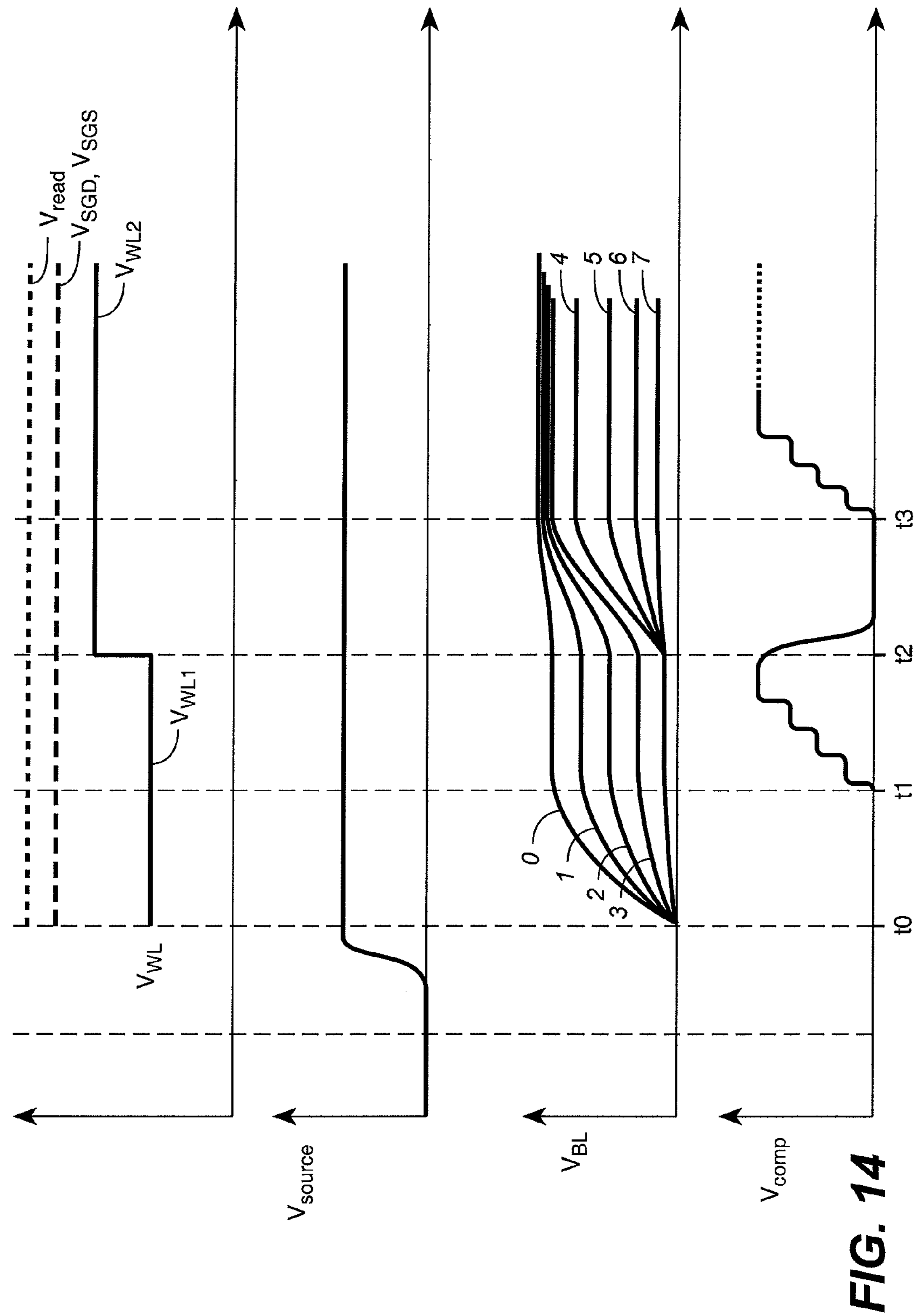
FIG. 14 illustrates a hybrid sensing technique according to an exemplary embodiment of the present invention.

FIG. 14 is arranged similarly to FIG. 11. It shows the process for a 3-bit per cell system that reads four states in a first sensing sub-operation and the other four states in a second sensing operation. In this example, the same set of comparison values are used for both subsets of states, although more generally a separate set of comparison values may be used in each sub-operation. As before, the process can be used for both data reading and program verify, where, as the target data can be known in a program operation, only the target state need be checked in whichever of the two sub-operations it would occur.

Referring to FIG. 14 in more detail, prior to time $t_0$, the situation is much as in FIG. 11, with the bit lines having been discharged, the source line being charged up, and the other transistors in the NAND string being set to allow this; for instance, keeping $V_{SGD}$ on and $V_{SGS}$ (or $V_{WL}$ or both) low.

Once these initial conditions are established, between $t_0$ and $t_1$ the source and drain select transistors are on, the non-selected transistors in the NAND string are turned on, and the word line is taken to a first value $V_{WL1}$. This allows the bit lines (or sense nodes) to charge up to the various levels depending on the cells' data state. $V_{WL1}$ is taken high enough so that states 0, 1, 2, and 3 can be separated, but not so high that the 0 and 1 states top out and cannot be differentiated. In this embodiment, $V_{WL1}$ leaves the higher states (4, 5, 6, and 7) unresolved.

Figure 13C:
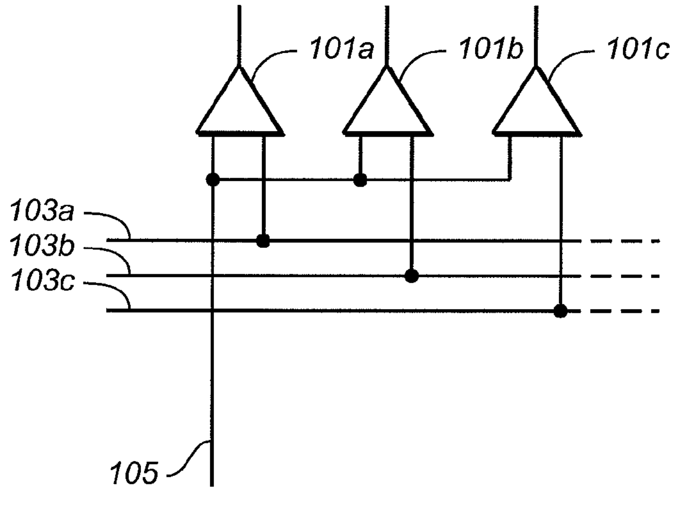

Once these states stabilize the sense node voltage can be compared with the various compare values as described above with respect to FIG. 11 between $t_1$ and $t_2$, although in this case four values instead of three are used and the corresponding changes need to be made in FIGS. 13A-C. This allows for a determination of whether each cell has data content corresponding to these lower states. Here, the sensing for the four states is done consecutively, although one or more of the comparisons can be concurrently as described above with respect to FIG. 13 (again with the change for four comparison points).

Once the first sensing sub-operation is done at $t_2$, the word line voltage is raised to $V_{WL2}$ to differentiate states resolved at $V_{WL1}$>$V_{WL2}$. (Here, the word line voltage is stepped up from one sensing operation to the next, although other embodiments could use $V_{WL1}$>$V_{WL2}$.) Between $t_2$ and $t_3$ the level on the bit lines transition from their response to $V_{WL1}$ to their response to $V_{WL2}$.

In the embodiment shown in FIG. 14, the bit lines are not discharged between the sensing sub-operations. In other embodiments, the bit lines can be discharged between $t_2$ and $t_3$ to, for example, stabilize the pre-charge level on the source side. This can be done in a number of ways, such as taking the selected word line voltage to ground, by taking $V_{SGS}$ to ground (with or without lowering $V_{WL2}$), or otherwise shutting off the source voltage while leaving the drain side open to discharge the cells on the selected word line. The preferred embodiment for accomplishing this will depend on the specifics of the particular memory, based on factors such as relative speed and power consumption needed to raise and lower the levels on these different lines. After re-discharging, the bit lines are then allowed to charge back up in response to $V_{WL2}$. The word bit line can be replaced in the above by the sensing node in order to cover the case where the sensing node is not the bit line as in the ABL architecture.

For any of the embodiments, at time $t_3$ the new word line voltage $V_{WL2}$ will have resolved some of the states that were not resolved for $V_{WL1}$. In the example, the bias conditions using $V_{WL2}$ are able to separate states 4, 5, 6, and 7, although the lower states (determined between $t_2$ and $t_2$) have now all coalesced above state 4. Once the bit line levels have sufficiently stabilized at $t_3$ the second sensing sub-operation is executed. Here, this is done in the same way and with the same values as for $V_{WL2}$, although different values and techniques could be used in the two cases. For the example, the two reads with the two word line values were sufficient to cover all of the cells. In other cases, the process can continue on to a third or more additional sensing sub-operations if needed to cleanly resolve all of the states.

The various alternate sensing techniques described in this section can be particularly advantageous when used in conjunction with a programming method that writes multiple states at the same time. Such a method allows the simultaneous programming of multiple states by proportionately retarding the programming of cells whose target threshold voltage levels are lower. This target state dependent retarding of programming is achieved by creating semi-inhibit or semi-boosting conditions of various strengths depending on the target state. The resulting efficiencies can greatly enhance memory performance by combining these verify/read methods with such concurrent programming of all, or at least multiple states. Such concurrent programming can be based on the program voltage of the different cells being dependent upon their target state (as described in U.S. Pat. No. 6,738,289, which is hereby incorporated by reference) or controller the program rate on a bit line by bit line basis based on the target state of each memory cell. Such bit line data dependent programming is described in U.S. patent application Ser. No. 11/196,547, which is hereby incorporated by reference, where either the voltage bias level, amount of current allowed to flow, or both is governed independently for each cell based on its corresponding target state. For any of these approaches, the number of programming pulses can be reduced; as the sensing techniques described above reduce the number of verify reads needed between each such pulse, the efficiencies combine multiplicatively to improve memory performance.

Alternate Use of Dielectric Storage Elements

The forgoing examples have been described with respect to the type of cell that utilizes conductive floating gates as charge storage elements. However, the various aspects of the present invention can be used in conjunction with nano-crystal memories, and phase change memories, MRAM, FERAM and the other various memory technologies described in U.S. patent application Ser. No. 10/841,379 filed May 7, 2004, which is hereby incorporated by reference. For example, the invention may also be implemented in a system that uses a charge trapping dielectric as the storage elements in individual memory cells in place of floating gates. The dielectric storage element is sandwiched between a conductive control gate and the substrate within the cell's channel region. Although the dielectric can be separated into individual elements with the same sizes and positions as the floating gates, it is usually not necessary to do so since charge is trapped locally by such a dielectric. The charge trapping dielectric can extend over the entire array except in areas occupied by the select transistors or the like.

Dielectric storage element memory cells are generally described in the following technical articles and patent, which articles and patent are incorporated herein in their entirety by this reference: Chan et al., "A True Single-Transistor Oxide-Nitride-Oxide EEPROM Device," *IEEE Electron Device Letters*, Vol. EDL-8, No. 3, March 1987, pp. 93-95; Nozaki et al., "A 1-Mb EEPROM with MONOS Memory Cell for Semiconductor Disk Application," *IEEE Journal of Solid State Circuits*, Vol. 26, No. 4, April 1991, pp. 497-501; Eitan et al., "NROM: A Novel Localized Trapping, 2-Bit Nonvolatile Memory Cell," *IEEE Electron Device Letters*, Vol. 21, No. 11, November 2000, pp. 543-545, and U.S. Pat. No. 5,851,881.

There are specific charge trapping dielectric materials and configurations that are practical for use. One is a three-layer dielectric with silicon dioxide initially grown on the substrate, a layer of silicon nitride deposited there over and another layer of silicon oxide, grown and/or deposited, over the silicon nitride layer ("ONO"). Another is a single layer of silicon rich silicon dioxide sandwiched between the gate and the semiconductor substrate surface. This later material is described in the following two articles, which articles are incorporated herein in their entirety by this reference: DiMaria et al., "Electrically-alterable read-only-memory using Si-rich $SIO_2$ injectors and a floating polycrystalline silicon storage layer," *J. Appl. Phys.* 52(7), July 1981, pp. 4825-4842; Hori et al., "A MOSFET with Si-implanted Gate-$SiO_2$ Insulator for Nonvolatile Memory Applications," IEDM 92, April 1992, pp. 469-472. Dielectric storage elements are also discussed further in the U.S. patent application Ser. No. 10/280,352, filed Oct. 25, 2002, which is hereby incorporated by this reference.

Although the present invention has been described in terms of specific examples and variations thereof, it is understood that the invention is to be protected within the full scope of the appended claims.

It is claimed:

1. A method of concurrently determining the state of a plurality of multi-state memory cells from a memory array, wherein said plurality of memory cells are connected along a common word line, have sources connected to a common source line, and are formed along distinct bit lines, the method comprising:

discharging the memory cells to ground through the corresponding bit lines;

subsequently applying a first voltage level to the common source line;

subsequently applying a second voltage level to the word line;

in response to applying the second voltage level to the word line, determining whether the data content of each of the memory cells corresponds to one of a first subset of said multi-states;

subsequently applying a third voltage level to the word line, wherein the third voltage level differs from the second voltage level; and in response to applying the third voltage level to the word line, determining whether the data content of each of the memory cells corresponds to one of a second subset of said multi-states, wherein the first and second subsets of said multi-states are distinct and each contain a plurality of states.

2. The method of claim 1, wherein determining whether the data content of each of the memory cells corresponds to one of a first or second subset of said multi-states includes:

allowing a voltage to develop upon each of the corresponding bit lines; and comparing the voltages developed along the bit lines to a plurality of reference values in order to determine the data content of the memory cells.

3. The method of claim 1, wherein the first and second subsets of said multi-states are non-overlapping.

4. The method of claim 1, wherein the combination of the first and second subsets of said multi-states contain less than all of said multi-states.

5. The method of claim 1, wherein said array has a NAND architecture.

6. The method of claim 1 wherein said array has an all bit line architecture.

7. The method of claim 1, wherein determining whether the data content of each of the memory cells corresponds to one of a first subset and determining whether the data content of each of the memory cells corresponds to one of a second subset are performed during the verification phase of a write operation.

8. The method of claim 1, wherein determining whether the data content of each of the memory cells corresponds to one of a first subset and determining whether the data content of each of the memory cells corresponds to one of a second subset are performed during a read operation.

9. A method of writing multi-state data concurrently to a plurality of multi-state memory cells from a memory array, wherein said plurality of memory cells are connected along a common word line, have sources connected to a common source line, and are formed along distinct bit lines, the method comprising:

applying a common programming pulse to the word line while controlling the amount of charge injected into each of said memory cell on a bit line by bit line basis based on the corresponding target state of each of said memory cells; and subsequently performing a verify operation, comprising:

discharging the memory cells to ground through the corresponding bit lines;

subsequently applying a first voltage level to the common source line;

subsequently applying a second voltage level to the word line;

in response to applying the second voltage level to the word line, determining whether the data content of each of the memory cells corresponds to one of a first subset of said multi-states;

subsequently applying a third voltage level to the word line, wherein the third voltage level differs from the second voltage level; and in response to applying the third voltage level to the word line, determining whether the data content of each of the memory cells corresponds to one of a second subset of said multi-states, wherein the first and second subsets of said multi-states are distinct and each contain a plurality of states.

10. The method of claim 9, wherein determining whether the data content of each of the memory cells corresponds to one of a first or second subset of said multi-states includes:

allowing a voltage to develop upon each of the corresponding bit lines; and comparing the voltages developed along the bit lines to a plurality of reference values in order to determine the data content of the memory cells.

11. The method of claim 9, wherein said controlling the amount of charge injected into each of said memory cell on a bit line by bit line basis based on the corresponding target state of each of said memory cells includes setting a voltage level on said bit lines on a bit line by bit line basis based on said corresponding target state of each of said memory cells.

12. The method of claim 9, wherein said controlling the amount of charge injected into each of said memory cell on a bit line by bit line basis based on the corresponding target state of each of said memory cells includes setting a current limit on said bit lines on a bit line by bit line basis based on said corresponding target state of each of said memory cells.

* * * * *